United States Patent [19]
Doguchi et al.

[11] Patent Number: 5,489,798
[45] Date of Patent: Feb. 6, 1996

[54] OPTO-ELECTRONIC INTEGRATED CIRCUIT

[75] Inventors: Kentaro Doguchi; Goro Sasaki; Hiroshi Yano; Sosaku Sawada, all of Yokohama, Japan

[73] Assignee: Sumitomo Electric Industries, Ltd., Osaka, Japan

[21] Appl. No.: 267,439

[22] Filed: Jun. 29, 1994

[30] Foreign Application Priority Data

Jul. 8, 1993 [JP] Japan ................... 5-169269

[51] Int. Cl.⁶ ................... H01L 29/06; H01L 29/78
[52] U.S. Cl. ................... 257/458; 257/462; 257/464
[58] Field of Search ................... 257/458, 462, 257/444, 197

[56] References Cited

U.S. PATENT DOCUMENTS 4,794,440  12/1988  Capasso et al. ................... 257/458
5,063,426  11/1991  Chandrasekhar et al. ............ 257/458

FOREIGN PATENT DOCUMENTS 63-302557  9/1988  Japan.
1-214159   8/1989  Japan.
1-262663  10/1989  Japan.

OTHER PUBLICATIONS

Sasaki et al., "Monolithic Integration of HEMTs & HBTs . . ." *IEDM*, 1989, pp. 30.8.1–30.8.3.
Nobuhara et al., "Planar Integration Tech. . . . ", *Optoelectronics* vol. 2 #2, Dec. 1987, pp. 303–311.
Chandrasekhar et al., "Integrated InP/GaInAs . . . " *Electronics Lttrs.* vol. 24 #33, Nov. 1988, pp. 1443–1444.
Eugene John et al., "Speed And Sensitivity Limitations Of Optoelectronic Receivers Based On MSM Photodiode And Millimeter–Wave HBT's On InP Substrate", IEEE Photonics Technology Letters, vol. 4, No. 10, published Oct. 1992, pp. 1145–1148.
Hiroshi Yano et al., "An Ultra–High–Speed Optoelectronic Integrated Receiver For Fiber–Optic Communications", IEEE Transactions On Electron Devices, vol. 39, No. 10, published Oct. 1992, pp. 2254–2259.
"An InP/InGaAs p–i–n/NBT Monolitich Transimpedance Photoreceiver", by S. Chandrasekhar, et al., pp. 505–506, IEEE Photonics Technology Letters, vol. 2, No. 7 (Jul. 1990).

*Primary Examiner*—Stephen D. Meier
*Attorney, Agent, or Firm*—Beveridge, DeGrandi, Weilacher & Young

[57] ABSTRACT

In an opto-electronic integrated circuit of the present invention, in a first surface region of a semiconductor substrate, a pin-type photodiode is constituted on the basis of a photodiode layer formed on a first transistor layer. In a second surface region of the semiconductor substrate, a heterojunction bipolar transistor is constituted on the basis of only a second transistor layer separated form the first transistor layer. Since a plurality of heterojunction bipolar transistors are normally integrated for one pin-type photodiode, the thickness of the heterojunction bipolar transistors larger in number than the pin-type photodiode is set regardless of the thickness of the pin-type photodiode. The thickness of a high-resistance layer in the pin-type photodiode is set with an increased degree of freedom. When the first surface region of the semiconductor substrate is the inner region of a recessed step portion, and the second surface region of the semiconductor substrate is the outer region of the recessed step portion, a difference in thickness between the heterojunction bipolar transistor and the pin-type photodiode is absorbed by the depth of the recessed step portion. For this reason, the pin-type photodiode and the heterojunction bipolar transistor are formed to have almost the same surface level.

23 Claims, 17 Drawing Sheets

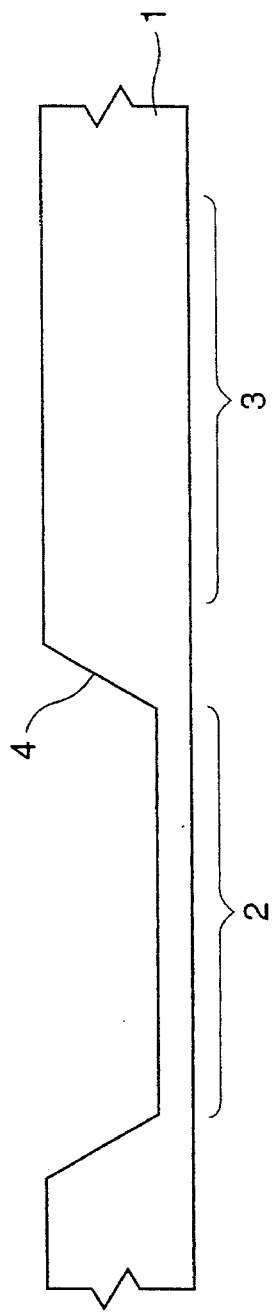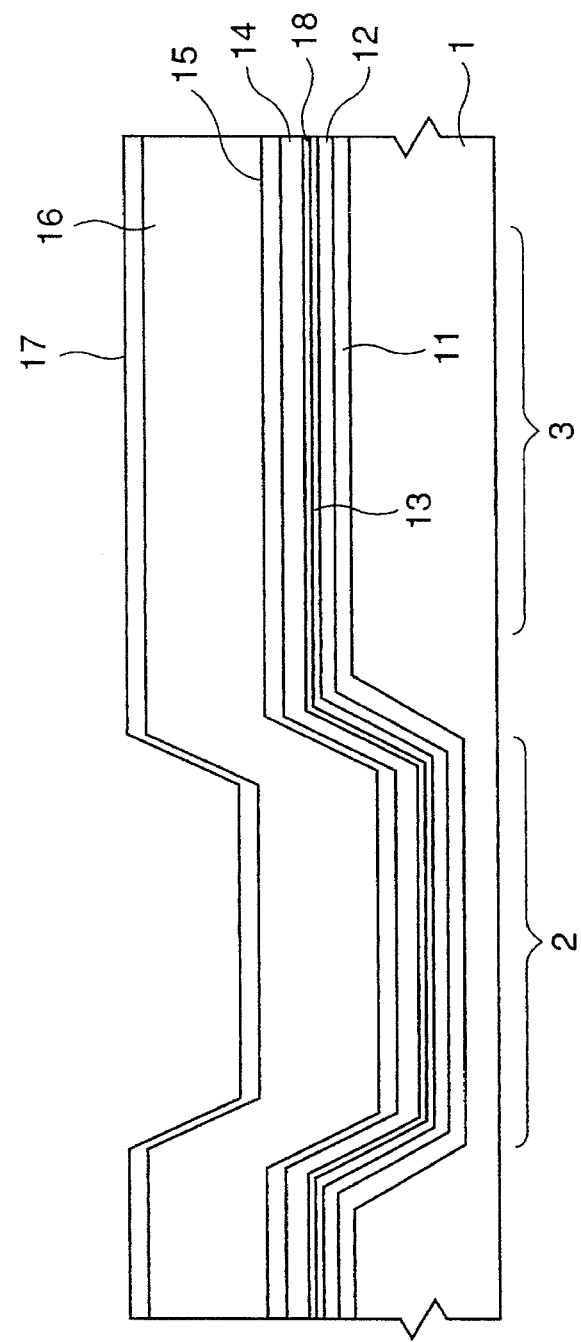

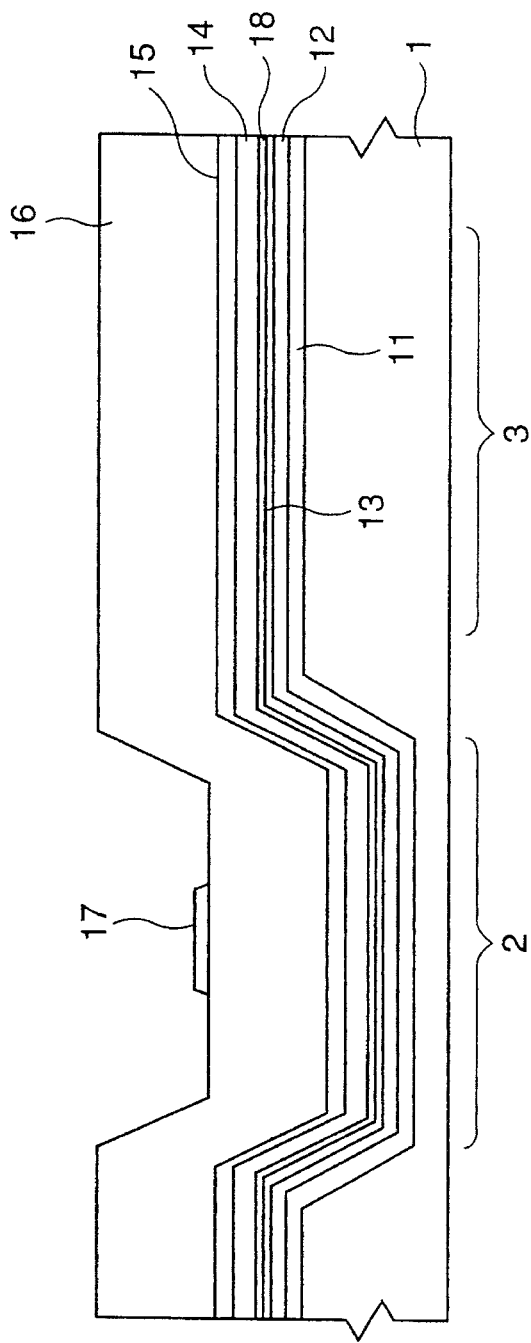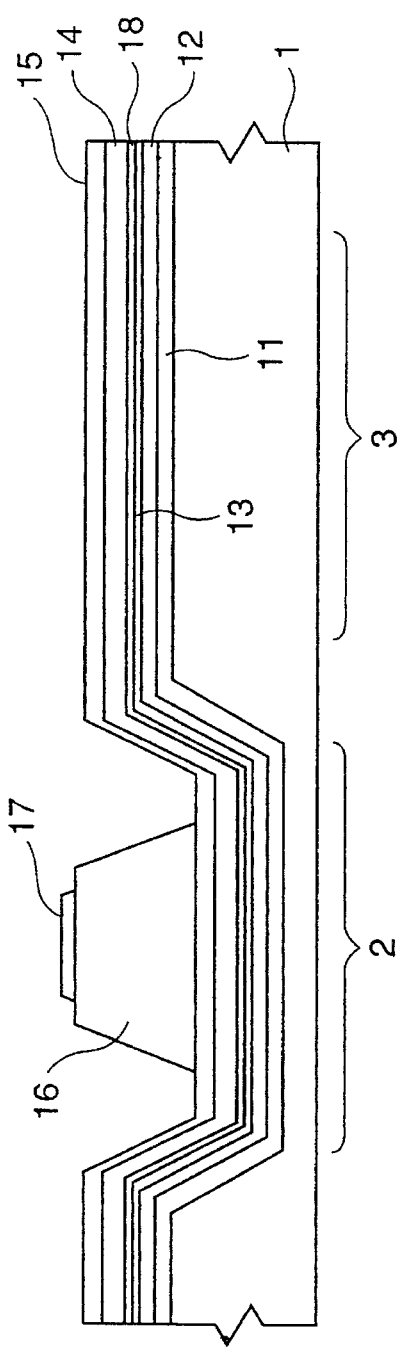

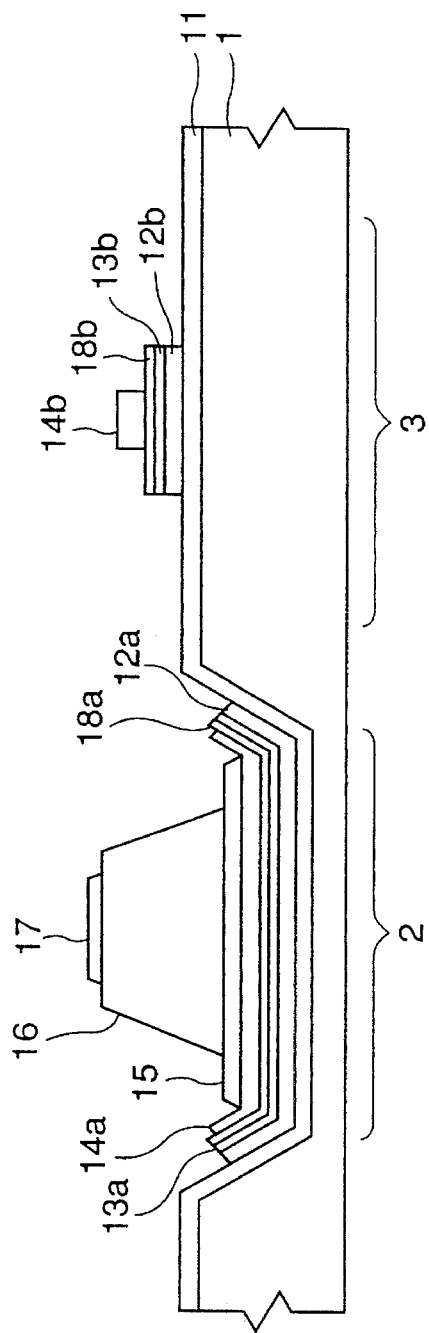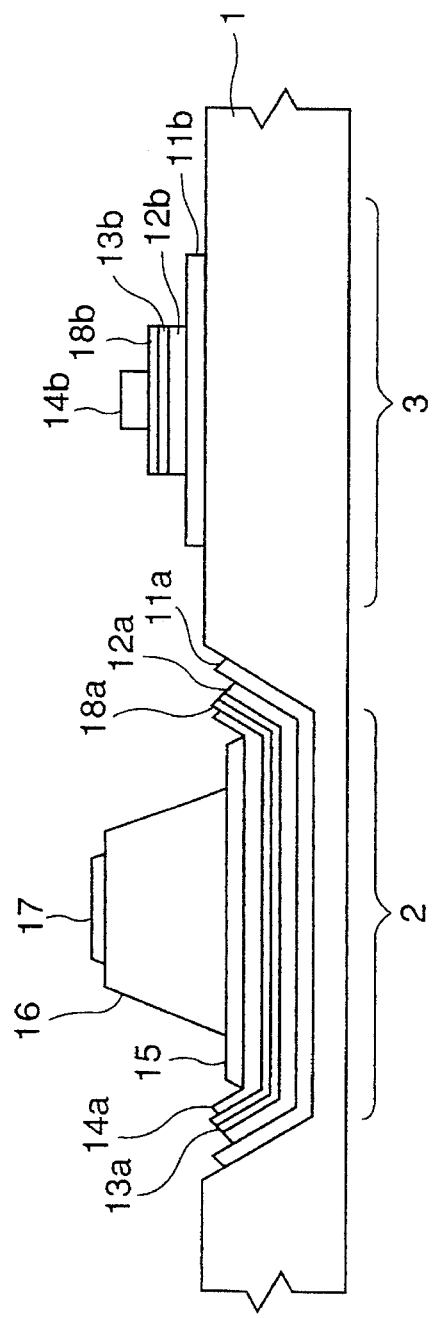

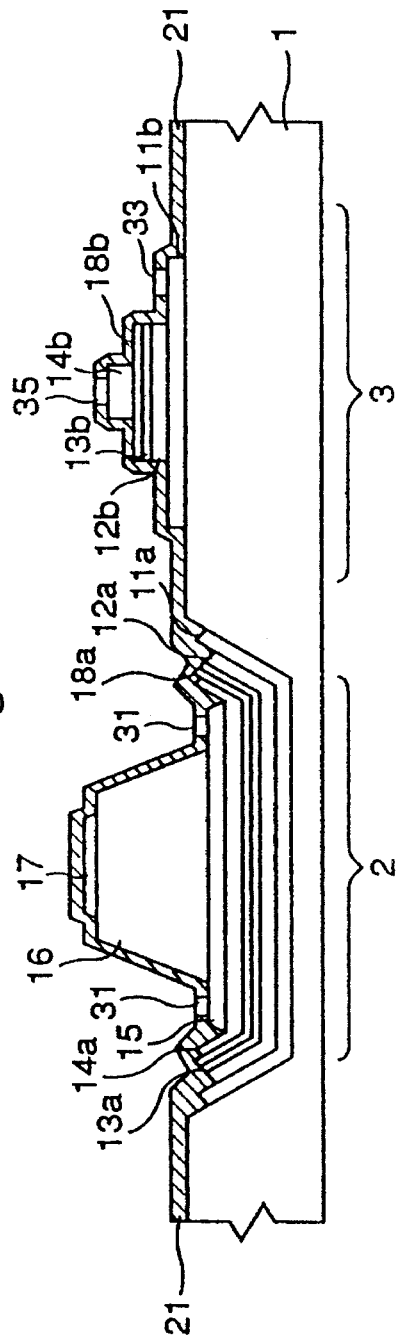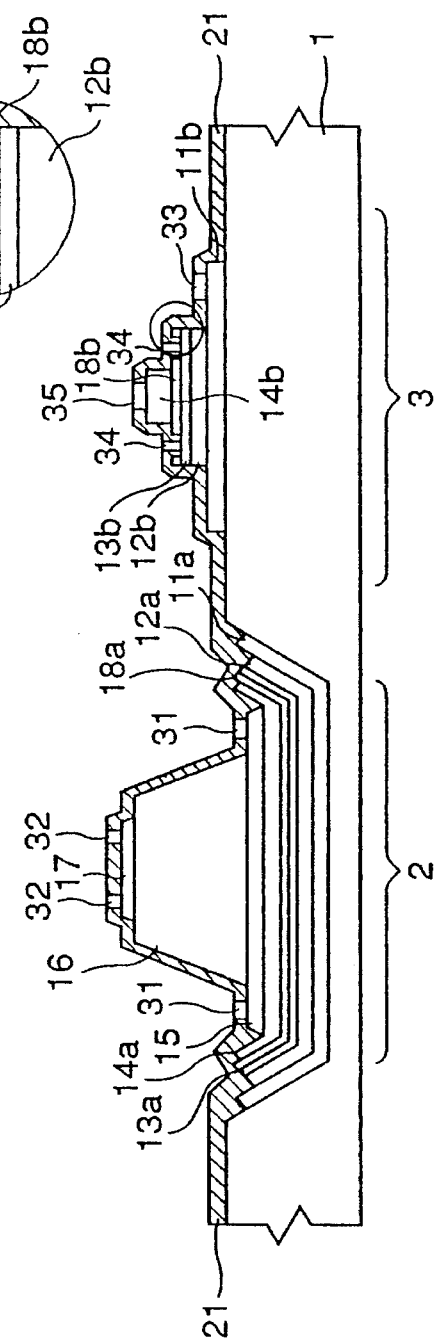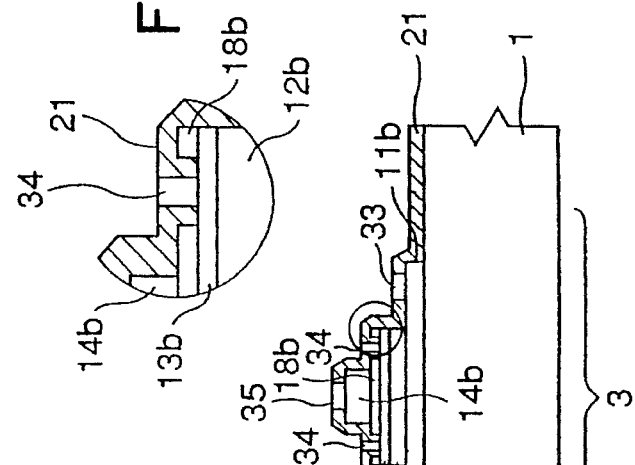

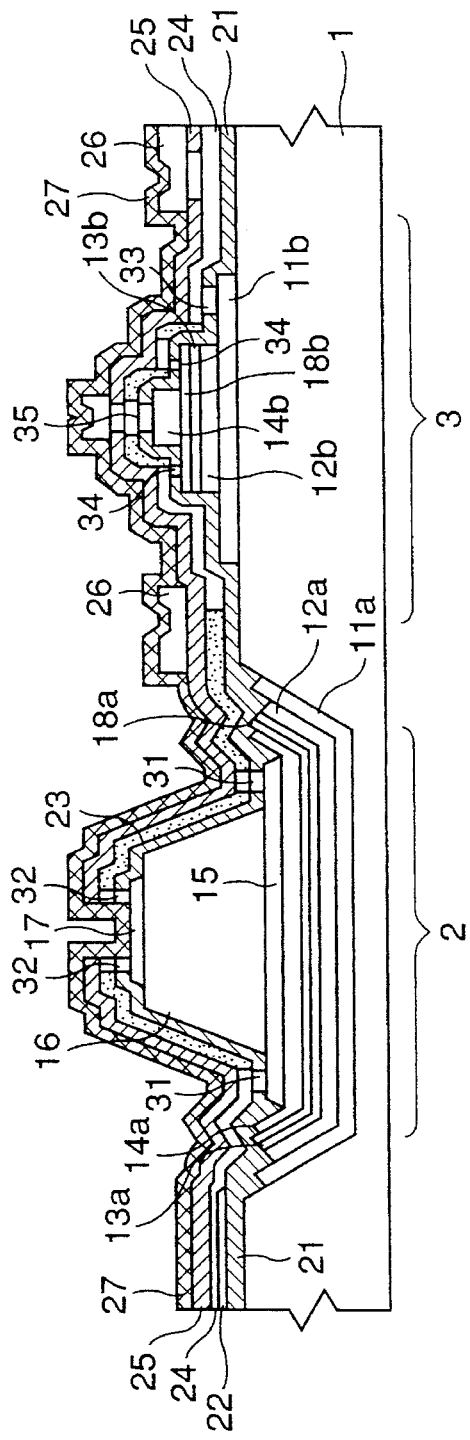
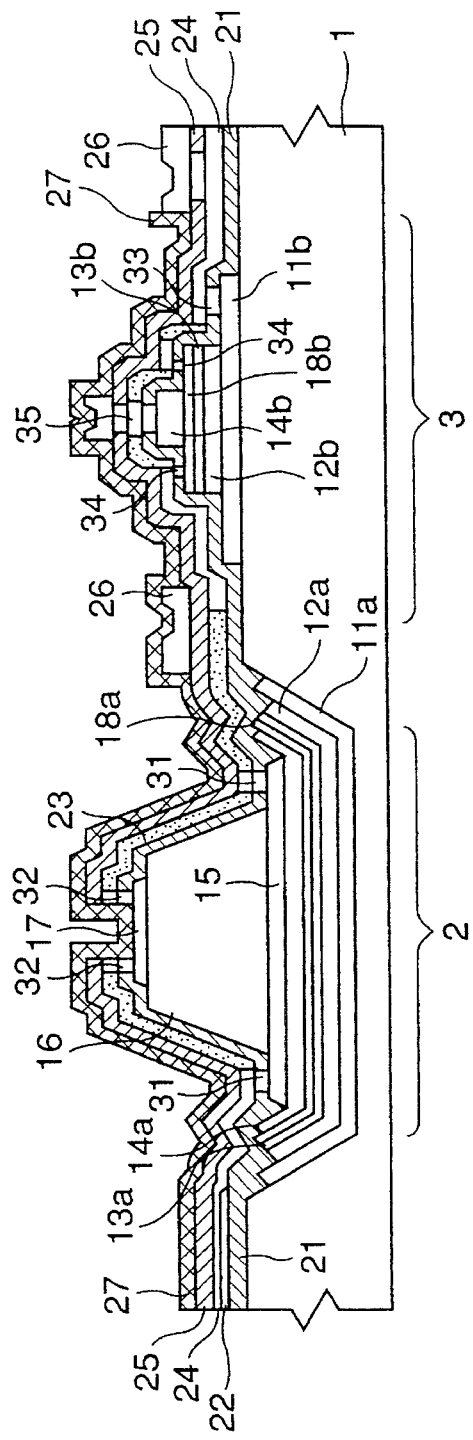

OPTO-ELECTRONIC INTEGRATED CIRCUIT

BACKGROUND OF THE INVENTION

1. Field of the Invention

The present invention relates to an opto-electronic integrated circuit having an optical device and an electronic device, both of which are monolithically integrated, and used in optical fiber communication or the like, and a method of manufacturing the same.

2. Related Background Art

Opto-electronic integrated circuits (OEIC) have been conventionally developed as reception front ends used in optical fiber communications or the like. An OEIC is constituted such that a pin-type photodiode (pin-PD) as a light receiving device and a heterojunction bipolar transistor (HBT) as an electronic device are monolithically integrated on an InP semiconductor substrate.

Such conventional techniques are described in detail in, e g., "IEEE Photonics Technology Letters, vol. 2, no. 7, pp. 505–506, Jul. 1990".

In the conventional opto-electronic integrated circuit, a photodiode layer and a transistor layer are sequentially epitaxially grown on a semiconductor substrate. The transistor layer is then removed from a pin-PD region to form a photodiode layer, and a transistor layer is formed in an HBT region, thereby completing a pin-PD and an HBT, respectively. In this case, the pin-PD is constituted by only the photodiode layer while the HBT is constituted by the photodiode layer and the transistor layer formed thereon.

In general, however, a photodiode layer has a thickness of about 2 to 3 μm, and a transistor layer has a thickness of about 1 μm. Hence, a large step is formed between the pin-PD and the HBT in the direction of thickness. This poses problems on manufacturing such that a resist film is non-uniformly coated upon formation of an etching mask to cause a mask failure, or a metal wiring disposed after formation of devices is disconnected.

In addition, a thicker pin-PD cannot be formed to prevent an increase in step between the pin-PD and the HBT, resulting in low conversion efficiency of received light.

Furthermore, since the resistor in the electronic circuit is formed using an epitaxially grown semiconductor layer, the resistance largely varies with respect to a temperature.

SUMMARY OF THE INVENTION

The present invention has been made in consideration of the above problems, and has as its object to provide an opto-electronic integrated circuit for decreasing process failures and improving the light conversion efficiency and resistance stability, and a method of manufacturing the same.

In order to achieve the above object, according to the present invention, there is provided an opto-electronic integrated circuit of the present invention comprising a semiconductor substrate, a pin-type photodiode formed in a first surface region of the semiconductor substrate, and a heterojunction bipolar transistor formed in a second surface region of the semiconductor substrate and electrically connected to the pin-type photodiode. The pin-type photodiode is constituted by a first transistor layer comprising a first collector layer, a first base layer, a first tunnel barrier layer, and a first emitter capping layer, all of which are sequentially formed in the first surface region, a photodiode layer comprising a layer of a first conductivity type, a high-resistance layer, and a layer of a second conductivity type, all of which are sequentially formed on the first transistor layer, and first electrode layers formed on the layers of the first and second conductivity types. The heterojunction bipolar transistor is constituted by a second transistor layer comprising a second collector layer, a second base layer, a second tunnel barrier layer, and a second emitter capping layer, all of which are sequentially formed in the second surface region, and separated from the first transistor layer, and second electrode layers respectively formed on the second collector layer, the second base layer, and the second emitter capping layer.

The first and second surface regions may be constituted as an inner region and a outer region of a recessed step portion having a predetermined depth, respectively.

A metal resistance layer electrically connected to the pin-type photodiode or the heterojunction bipolar transistor may be formed in a third surface region of the semiconductor substrate.

The first and second electrode layers may be formed of the same material to have a multilayered structure including a Pt layer as the lowermost layer.

In order to achieve the above object, according to the present invention, there is provided a method of manufacturing an opto-electronic integrated circuit, comprising the first step of sequentially epitaxially growing a collector layer, a base layer, a tunnel barrier layer, an emitter capping layer, a layer of a first conductivity type, a high-resistivity layer, and a layer of a second conductivity type on a semiconductor substrate, the second step of sequentially partially etching and removing the layer of the second conductivity type, the high-resistivity layer, and the layer of the first conductivity type to form a pin-type photodiode in a first surface region of the semiconductor substrate, the third step of sequentially partially etching and removing the emitter capping layer, the tunnel barrier layer, the base layer, and the collector layer to form a heterojunction bipolar transistor in a second surface region of the semiconductor substrate, and the fourth step of forming predetermined electrode layers on the layer of the first conductivity type, the layer of the second conductivity type, the collector layer, the base layer, and the emitter capping layer.

The first step may include the step of partially etching and removing the semiconductor substrate to form the first and second surface regions as an inner region and an outer region of a recessed step portion having a predetermined depth, respectively. In this case, it is preferable that the first step includes the steps of etching and removing a predetermined surface region of the semiconductor substrate to form a first alignment mark, performing positioning on the basis of the first alignment mark to form a first etching mask on the semiconductor substrate, and thereafter forming the recessed step portion in correspondence with the first etching mask, the second step includes the steps of performing positioning on the basis of the first alignment mark and etching and removing a predetermined surface region of the layer of the second conductivity type to form a second alignment mark, performing positioning on the basis of the second alignment mark to form a second etching mask on the layer of the second conductivity type, and thereafter forming the pin-type photodiode in correspondence with the second etching mask, and the third step includes the steps of performing positioning on the basis of the second alignment mark to form a third etching mask on the emitter capping layer, and thereafter forming the heterojunction bipolar transistor in correspondence with the third etching mask. Note that the first step preferably includes the step of forming the first alignment mark as a predetermined pattern having two-dimensionally aligned recessed portions.

The first step may include the step of forming the emitter capping layer and the layer of the first conductivity type by different materials.

The first step may include the step of forming the emitter capping layer and the layer of the first conductivity type by the same material as a common layer. In this case, the first step preferably includes the step of forming an etching stop layer consisting of a material having a band gap energy different from that of a constituent material of the common layer inside the common layer or at a junction portion between the common layer and the high-resistivity layer.

The fourth step may include the step of forming a metal resistance layer electrically connected to the pin-type photodiode or the heterojunction bipolar transistor in a third surface region of the semiconductor substrate.

The fourth step may include the step of simultaneously forming electrode layers. In this case, the fourth step preferably includes the step of forming the electrode layers to have a multilayered structure including a Pt layer as the lowermost layer. The fourth step preferably includes the step of simultaneously forming, together with the electrode layers, a metal wiring layer electrically connected to the pin-type photodiode or the heterojunction bipolar transistor in a fourth surface region of the semiconductor substrate.

In the opto-electronic integrated circuit of the present invention, in the first surface region of the semiconductor substrate, the pin-type photodiode is constituted on the basis of the photodiode layer formed on the first transistor layer. On the other hand, in the second surface region of the semiconductor substrate, the heterojunction bipolar transistor is constituted on the basis of only the second transistor layer separated from the first transistor layer. Since a plurality of heterojunction bipolar transistors are normally integrated for one pin-type photodiode, the thickness of the heterojunction bipolar transistors larger in number than the pin-type photodiode is set regardless of the thickness of the pin-type photodiode. Therefore, the thickness of a high-resistivity layer in the pin-type photodiode is set with an increased degree of freedom.

When the first surface region of the semiconductor substrate is the inner region of a recessed step portion, and the second surface region of the semiconductor substrate is the outer region of the recessed step portion, a difference in thickness between the heterojunction bipolar transistor and the pin-type photodiode is absorbed by the depth of the recessed step portion. For this reason, the pin-type photodiode and the heterojunction bipolar transistor are formed to have almost the same surface level.

When a metal resistance layer electrically connected to the pin-type photodiode or the heterojunction bipolar transistor is formed, variations in resistance with respect to a temperature are decreased as compared to a resistance layer formed of a semiconductor.

When all the first and second electrode layers are formed of the same material to include a Pt layer as the lowermost layer, the electrode characteristics with respect to the semiconductor layers are improved as compared to electrode layers having a lowermost layer formed of a material except for Pt.

In the method of manufacturing the opto-electronic integrated circuit of the present invention, the transistor and photodiode layers are sequentially formed on the semiconductor substrate in the first step, the semiconductor layers constituting the exposed photodiode layer as an upper layer are sequentially shaped in the second step, and the semiconductor layers constituting the transistor layer exposed upon removing the photodiode layer are sequentially shaped in the third step. For this reason, in the first surface region of the semiconductor substrate, the pin-type photodiode is constituted on the basis of the photodiode layer formed on the transistor layer. On the other hand, in the second surface region of the semiconductor substrate, the heterojunction bipolar transistor is constituted on the basis of only the transistor layer. Since a plurality of heterojunction bipolar transistors are commonly integrated for one pin-type photodiode, the thickness of the heterojunction bipolar transistors larger in number than the pin-type photodiode is set regardless of the thickness of the pin-type photodiode. Therefore, the high-resistivity layer in the pin-type photodiode is set with an increased degree of freedom.

When the transistor and photodiode layers are sequentially formed after the recessed step portion is formed in the semiconductor substrate in the first step, the pin-type photodiode is formed in the inner region of the recessed step portion, and the heterojunction bipolar transistor is formed in the outer region of the recessed step portion. For this reason, a difference in thickness between the heterojunction bipolar transistor and the pin-type photodiode is absorbed by the depth of the recessed step portion, and the pin-type photodiode and the heterojunction bipolar transistor are formed to have almost the same surface level.

In this case, positioning is performed on the basis of the first alignment mark formed on the semiconductor substrate to form the recessed step portion in the first step, positioning is performed on the basis of the first alignment mark to form the second alignment mark on the uppermost semiconductor layer in the second step, and positioning is performed on the basis of the second alignment mark to form the pin-type photodiode and the heterojunction bipolar transistor in the second and third steps. For this reason, the pin-type photodiode and the heterojunction bipolar transistor are arranged on the inner and outer regions of the recessed step portion, respectively, with high alignment accuracy.

In the first step, the first alignment mark is formed by two-dimensionally aligning the recessed portions, and the semiconductor layers constituting the transistor and photodiode layers are sequentially epitaxially grown on the semiconductor substrate. For this reason, as compared to a technique of two-dimensionally aligning projecting portions to form the first alignment mark, the difference in growth rate between the semiconductor layers with respect to different crystal faces on the surface of the semiconductor substrate is decreased. Therefore, the semiconductor layers are prevented from being deformed in the growth process.

In the first step, the emitter capping layer and the layer of the first conductivity type, i.e., the semiconductor layers in the boundary region where the transistor and photodiode layers are joined with each other, are formed of different materials on the semiconductor substrate. At this time, when an etchant is appropriately selected in correspondence with the material of each semiconductor layer in the second step, the layer of the first conductivity type is etched and removed without simultaneously etching and removing the emitter capping layer. Therefore, after the pin-type photodiode is formed, the heterojunction bipolar transistor is formed with high reliability as desired.

In the first step, the emitter capping layer and the layer of the first conductivity type are formed of the same material as a common layer. For this reason, as compared to the semiconductor layers consisting of different materials, one process of the epitaxial growth is eliminated to decrease the operation steps.

In this case, an etching stop layer is formed inside the common layer or at the junction portion between the common layer and the high-resistivity layer. When an etchant is appropriately selected in correspondence of the materials of these semiconductor layers, the common layer constituting the heterojunction bipolar transistor is not simultaneously etched and removed upon etching and removing the common layer constituting the pin-type photodiode. For this reason, after formation of the pin-type photodiode, the heterojunction bipolar transistor is formed with high reliability as desired.

In the fourth step, a metal resistance layer electrically connected to the pin-type photodiode or the heterojunction bipolar transistor is formed. For this reason, variations in resistance with respect to a temperature are decreased as compared to a resistance layer formed of a semiconductor.

In the fourth step, the electrode layers are simultaneously formed. For this reason, as compared to a case wherein electrode layers having the ohmic contact properties of different conductivity types are formed in different processes, one process of electrode formation is eliminated to decrease the operation steps.

In this case, the electrode layers are formed to include a Pt layer as the lowermost layer in the fourth step. For this reason, the electrode characteristics with respect to the semiconductor layers are improved as compared to electrode layers having a lowermost layer formed of a material except for Pt. In the fourth step, the metal wiring layer electrically connected to the pin-type photodiode or the heterojunction bipolar transistor is simultaneously formed with the electrode layers. For this reason, as compared to the case wherein the electrode layers and the metal wiring layer are formed in different processes, one process of electrode and wiring formation is eliminated to further decrease the operation steps.

BRIEF DESCRIPTION OF THE DRAWINGS

FIGS. 4 to 19 are sectional views showing steps in the manufacture of the opto-electronic integrated circuit in FIG. 1;

DETAILED DESCRIPTION OF THE PREFERRED EMBODIMENT

Figure 1:
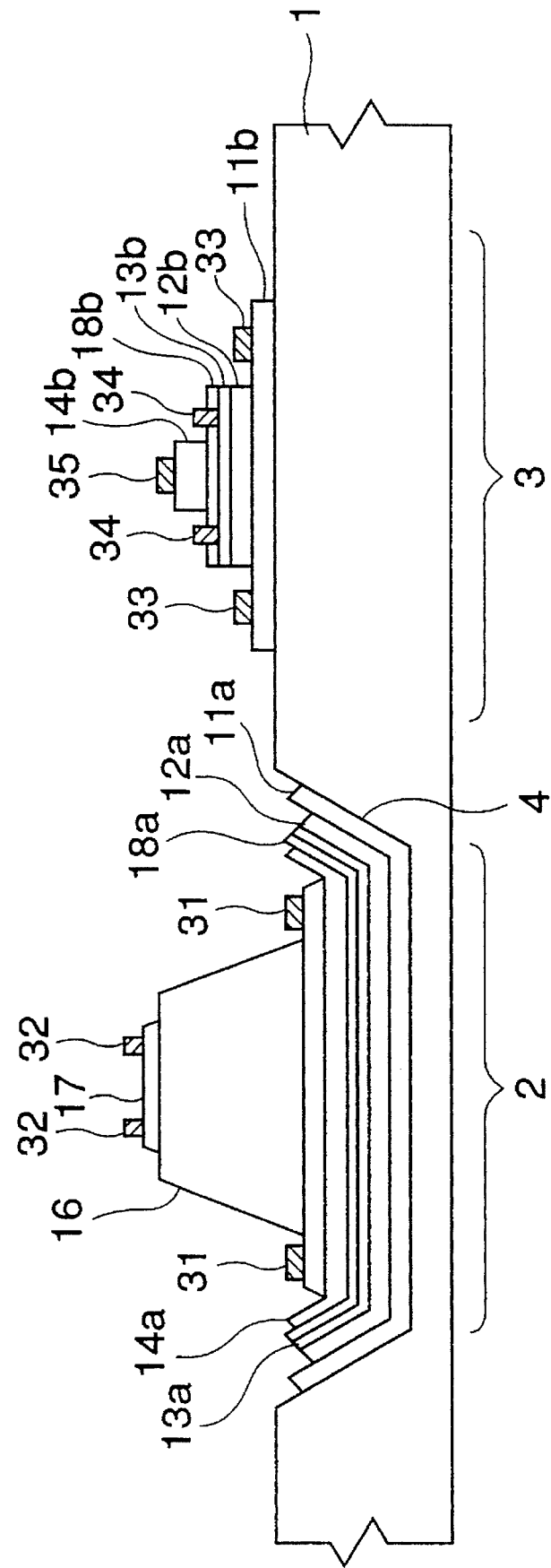
FIG. 1 is a sectional view showing the structure of the main part of an opto-electronic integrated circuit according to an embodiment of the present invention.

The structure and function of an embodiment according to the present invention will be described below with reference to FIGS. 1 to 26. The same reference numerals and symbols throughout the drawings denote the same elements, and a duplicated description thereof will be omitted.

Figure 2:
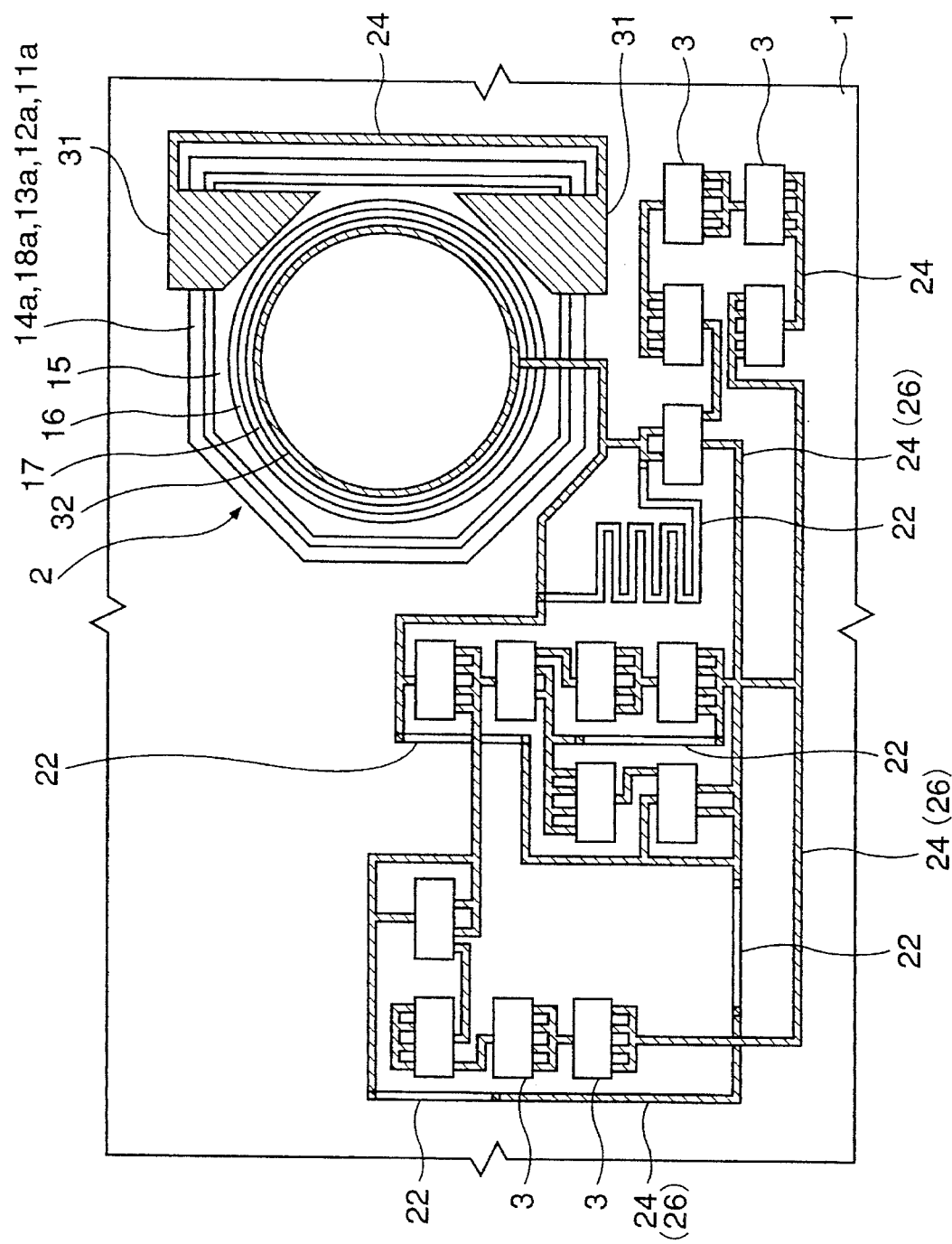
FIG. 2 is a plan view showing the entire structure of the opto-electronic integrated circuit in FIG. 1.
Figure 3:
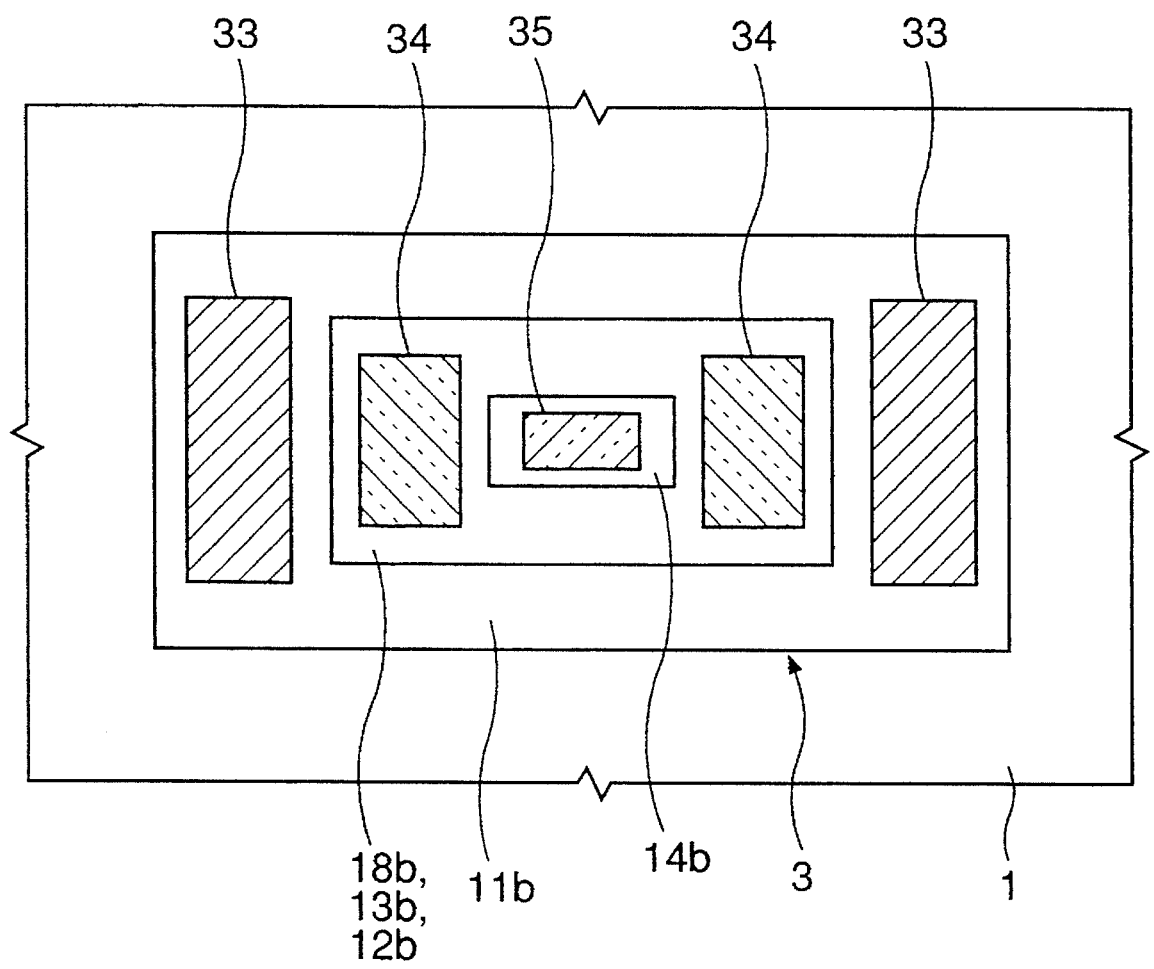
FIG. 3 is a plan view showing the structure of a heterojunction bipolar transistor in FIG. 2 in detail.

FIG. 1 is a sectional view showing the structure of the main part of an opto-electronic integrated circuit according to an embodiment of the present invention. FIG. 2 is a plan view showing the entire structure of the opto-electronic integrated circuit in FIG. 1. FIG. 3 is a plan view showing the structure of a heterojunction bipolar transistor in FIG. 2 in detail.

In this opto-electronic integrated circuit, a pin-PD as an optical device and an HBT as an electronic device are monolithically integrated on a semiconductor substrate 1. A recessed step portion 4 having a predetermined depth is formed in the surface region of the semiconductor substrate 1. In the inner region of the recessed step portion 4, the pin-PD is arranged as a pin-PD region 2. In a outer region of the recessed step portion 4, the HBT is arranged as an HBT region 3.

In the pin-PD region 2, a first transistor layer comprising collector layers 11a and 12a, a base layer 13a, a tunnel barrier layer 18a, and an emitter capping layer 14a, and a photodiode layer comprising an n-type layer 15, an i-type layer 16, and a p-type layer 17 are sequentially formed on the semiconductor substrate 1. These semiconductor layers are formed to be included in the inner region of the recessed step portion 4. Particularly, the n-type layer 15, the i-type layer 16, and the p-type layer 17 are formed into a mesa shape. In the surface regions of the n-type layer 15 and the p-type layer 17, a cathode electrode layer 31 and an anode electrode layer 32 are formed at predetermined positions, respectively.

In the HBT region 3, a second transistor layer comprising collector layers 11b and 12b, a base layer 13b, a tunnel barrier layer 18b, and an emitter capping layer 14b is formed on the semiconductor substrate 1. These semiconductor layers are formed into a staircase shape to be included in the outer region of the recessed step portion 4. That is, the first and second transistor layers are separated from each other. In the surface regions of the collector layer 11b, the base layer 13b, and the emitter capping layer 14b, collector electrode layers 33, base electrode layers 34, and an emitter electrode layer 35 are formed at predetermined positions, respectively.

The semiconductor substrate 1 is formed of Fe-doped InP. The collector layers 11a and 11b are formed of n+-type GaInAs having a dopant concentration of about $1\times10^{19}$ $cm^{-3}$. The collector layers 12a and 12b are formed of n-type GaInAs having a dopant concentration of about $5\times10^{16}$ $cm^{-3}$. The collector layers 11a and 12a and the collector layers 11b and 12b have a total thickness of about 800 nm. The base layers 13a and 13b are formed of p-type GaInAs having a dopant concentration of about $8\times10^{18}$ $cm^{-3}$ and a thickness of about 100 nm. The tunnel barrier layers 18a and 18b are formed of n-type InP having a dopant concentration of about $4\times10^{18}$ $cm^{-3}$ and a thickness of about 10 nm. The emitter capping layers 14a and 14b are formed of n-type GaInAs having a dopant concentration of about $4 \times 10^{18}$ cm$^{-3}$ and a thickness of about 400 nm.

The n-type layer 15 is formed of n-type InP having a dopant concentration of about $8 \times 10^{18}$ cm$^{-3}$ and a thickness of about 270 nm. The i-type layer 16 is formed of intentionally undoped i-type GaInAs having a thickness of about 2 μm. The p-type layer 17 is formed of p-type GaInAs having a dopant concentration of about $1.1 \times 10^{19}$ cm$^{-3}$ and a thickness of about 350 nm.

All of the cathode electrode layer 31, the collector electrode layer 33, and the emitter electrode layer 35 are formed of AuGe/Ni having n-type ohmic contact properties. Both the anode electrode layer 32 and the base electrode layer 34 are formed of Ti/Pt/Au having p-type ohmic contact properties.

In the outer region of the recessed step portion 4, 10 to 20 HBTs are arranged for one pin-PD through metal resistance layers 22. These pin-PD, HBTs, and metal resistance layers 22 are electrically connected by lower metal wiring layers 24 or upper metal wiring layers 26 arranged on the basis of the multilayered wiring technique. Insulating layers and an anti-reflection layer, which are coated on the pin-PD and HBTs, and pad portions connected to the metal wiring layers 24 and 26 are not shown.

The metal resistance layer 22 is formed of NiCrSi. Both the metal wiring layers 24 and 26 are formed of Ti/Au.

The function of the above embodiment will be described below.

In this opto-electronic integrated circuit, the pin-PD is constituted on the basis of the photodiode layer formed on the first transistor layer in the pin-PD region 2 of the semiconductor substrate 1. On the other hand, in the HBT region 3 of the semiconductor substrate 1, the HBT is constituted on the basis of only the second transistor layer separated from the first transistor layer. Since a plurality of HBTs are normally integrated for one pin-PD, the thickness of the HBTs larger in number than the pin-PD is set regardless of the thickness of the pin-PD. Therefore, the thickness of the high-resistivity layer 16 in the pin-PD is set with an increased degree of freedom.

Since the pin-PD region 2 is the inner region of the recessed step portion 4, and the HBT region 3 is the outer region of the recessed step portion 4, a difference in thickness between the HBT and the pin-PD is absorbed by the depth of the recessed step portion 4. For this reason, the pin-PD and the HBT are formed to have almost the same surface level.

The metal resistance layer 22 is electrically connected to the pin-PD or HBT. In this case, variations in resistance with respect to a temperature is decreased as compared to a resistance layer formed of a semiconductor, improving temperature characteristics of the opto-electronic integrated circuit.

A method of manufacturing the opto-electronic integrated circuit of the above embodiment will be described below.

Figure 20:
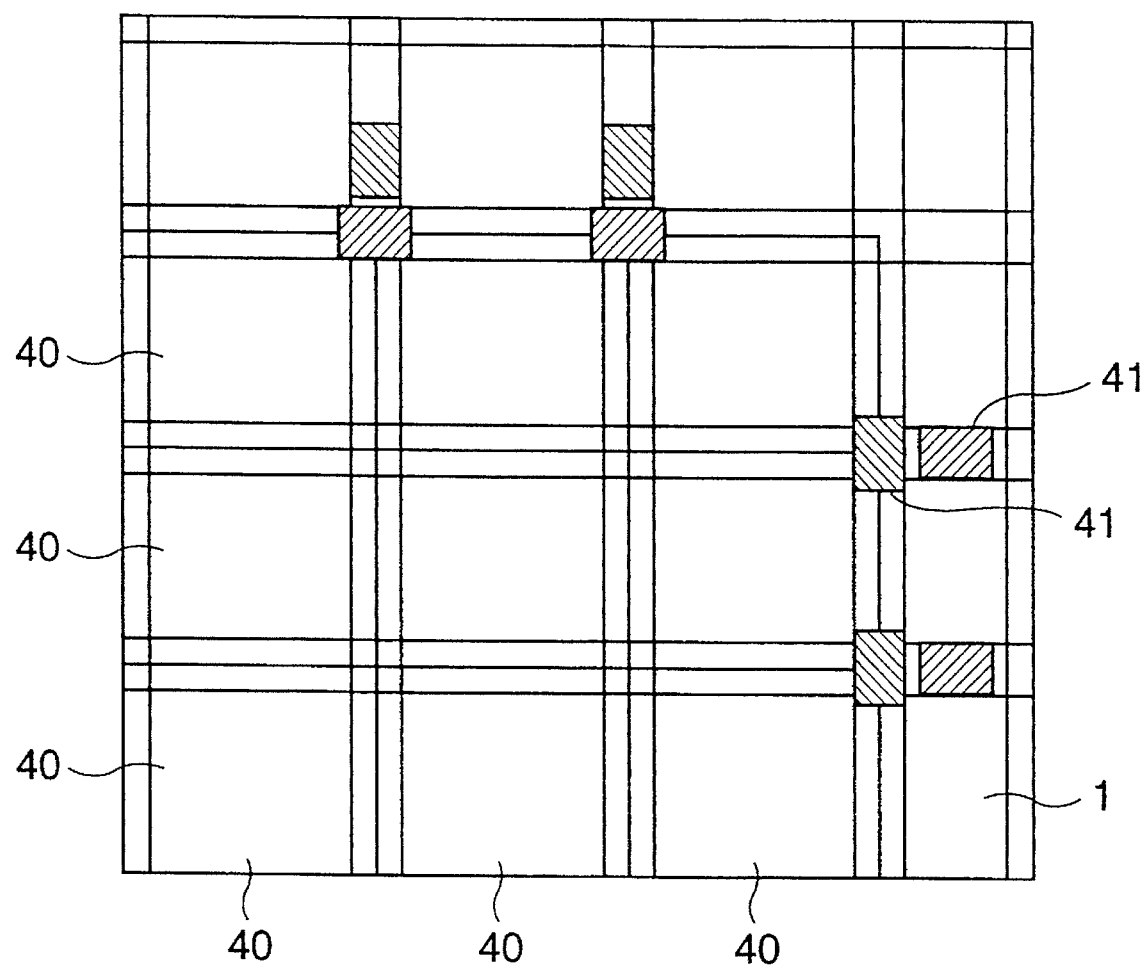
FIG. 20 is a plan view showing a semiconductor substrate constituted by chip regions forming the opto-electronic integrated circuit in FIG. 1.
Figure 21:
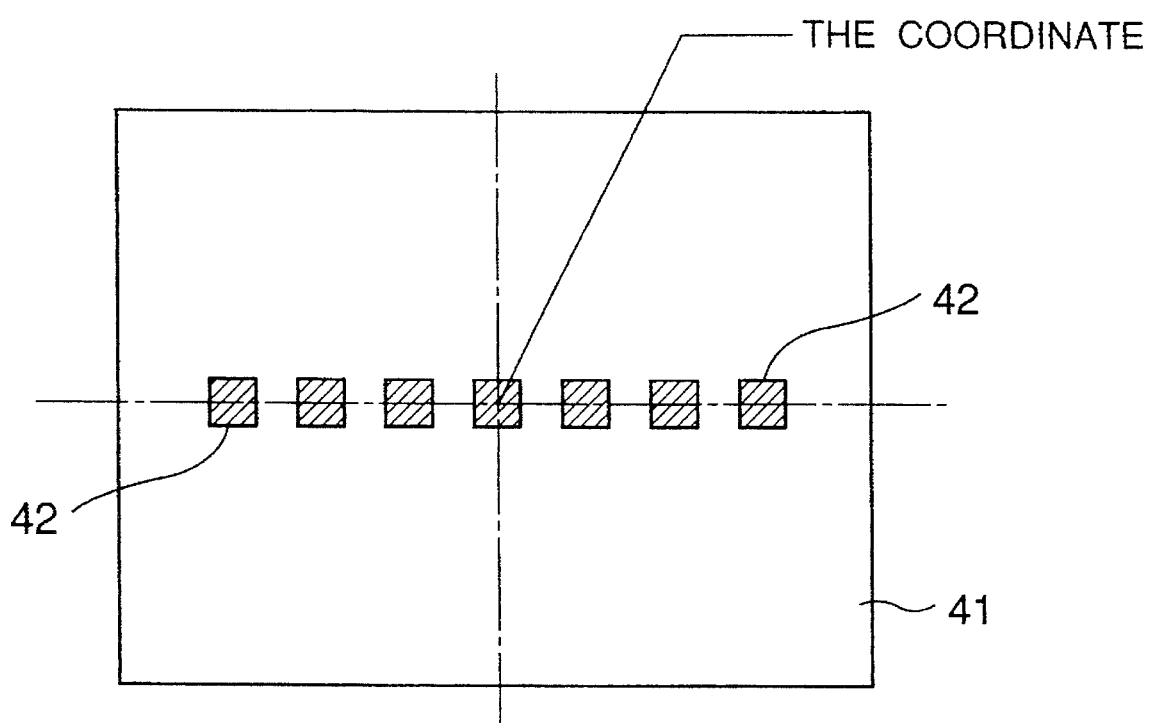
FIG. 21 is a plan view showing the arrangement of alignment marks in FIG. 20.

FIGS. 4 to 19 are sectional views showing steps in the manufacture of the opto-electronic integrated circuit in FIG. 1. FIG. 20 is a plan view showing the semiconductor substrate constituted by chip regions forming the opto-electronic integrated circuit in FIG. 1. FIG. 21 is a plan view showing the arrangement of alignment marks in FIG. 20.

First of all, using the conventional photolithography and etching techniques, the peripheral portions of chip regions 40 of the semiconductor substrate 1 are partially etched and removed to form a plurality of alignment marks 41 as alignment marks $A_1$, as shown in FIG. 20. Positioning is performed on the basis of the coordinates of the alignment marks $A_1$, and an etching mask $E_1$ (not shown) is formed on the semiconductor substrate 1. The surface region of the semiconductor substrate 1 is partially etched and removed in correspondence with the pattern of the etching mask $E_1$ to form the recessed step portion 4 having a predetermined depth in the pin-PD region 2 (FIG. 4).

The plurality of alignment marks 41 are arranged along two directions perpendicular to each other on the semiconductor substrate 1. As shown in FIG. 21, each alignment mark 41 is constituted by two-dimensionally aligning recessed portions 42. The position of the central recessed portion 42 represents predetermined coordinates.

Collector layers 11 and 12, a base layer 13, a tunnel barrier layer 18, an emitter capping layer 14, the n-type layer 15, the i-type layer 16, and the p-type layer 17 are sequentially formed on the semiconductor substrate 1 by the normal epitaxial growing technique (FIG. 5).

As the epitaxial growing method, the organic metal vapor phase epitaxy (OMVPE) is used at a pressure of about 60 Torr and a substrate temperature of about 650° C., and a reaction gas is appropriately selected in correspondence with a to-be-formed semiconductor layer. As a reaction gas, trimethylindium (TMI) and phosphine (PH$_3$) are used to form the InP layers, and trimethylgallium (TMG), trimethylindium, and arsine (AsH$_3$) are used to form the GaInAs layers.

Positioning is performed on the basis of the alignment marks $A_1$, and the surface region of the p-type layer 17 is partially etched and removed to form alignment marks $A_2$ having the same arrangement as the alignment marks $A_1$. Positioning is performed on the basis of the coordinates of the alignment marks $A_2$ to form an etching mask $E_2$ (not shown) on the p-type layer 17. The p-type layer 17 is shaped in correspondence with the pattern of the etching mask $E_2$ using the selective etching and partially left in the pin-PD region 2 (FIG. 6).

By the same method used for the etching mask $E_2$, an etching mask $E_3$ (not shown) is formed on the i-type layer 16. Using the selective etching, the i-type layer 16 is shaped in correspondence with the pattern of the etching mask $E_3$ and partially left in the pin-PD region 2 (FIG. 7).

Figure 8:
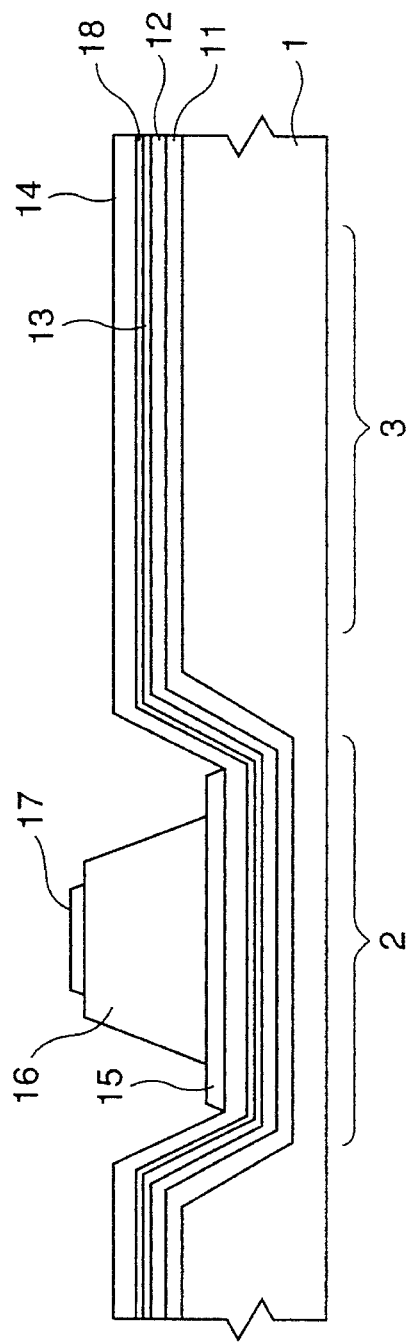

By the same method used for the etching mask $E_2$, an etching mask $E_4$ (not shown) is formed on the n-type layer 15. Using the selective etching, the n-type layer 15 is shaped in correspondence with the pattern of the etching mask $E_4$ and partially left in the pin-PD region 2 (FIG. 8).

Figure 9:
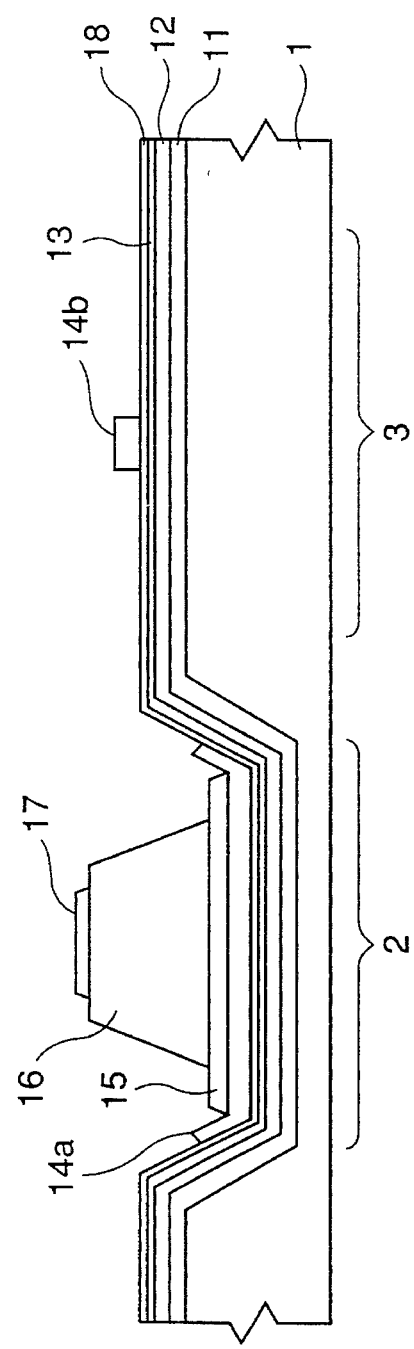

By the same method used for the etching mask $E_2$, an etching mask $E_5$ (not shown) is formed on the emitter capping layer 14. Using the selective etching, the emitter capping layer 14 is shaped in correspondence with the pattern of the etching mask $E_5$ to form the emitter capping layers 14a and 14b in the pin-PD region 2 and the HBT region 3, respectively (FIG. 9).

By the same method used for the etching mask $E_2$, an etching mask $E_6$ (not shown) is formed on the tunnel barrier layer 18. Using the selective etching, the tunnel barrier layer 18, the base layer 13, and the collector layer 12 are shaped in correspondence with the pattern of the etching mask $E_6$ to form the tunnel barrier layer 18a, the base layer 13a, and the collector layer 12a in the pin-PD region 2, and at the same time, form the tunnel barrier layer 18b, the base layer 13b, and the collector layer 12b in the HBT region 3 (FIG. 10).

By the same method used for the etching mask $E_2$, an etching mask $E_7$ (not shown) is formed on the collector layer 11. Using the selective etching, the collector layer 11 is shaped in correspondence with the pattern of the etching mask E$_7$ to form the collector layers 11a and 11b in the pin-PD region 2 and the HBT region 3, respectively. At this time, the pin-PD region 2 and the HBT region 3 are not only electrically but also physically isolated from each other (FIG. 11).

As the selective etching method, an etchant is appropriately selected in correspondence with a to-be-etched semiconductor layer. As the components of the etchant, HCl and H$_2$O are used to etch the InP layers, and H$_3$PO$_4$, H$_2$O, and H$_2$O$_2$ are used to etch the GaInAs layers.

An insulating layer 21 is deposited on the surface of the semiconductor substrate 1 including the pin-PD region 2 and the HBT region 3. The insulating layer 21 is partially etched and removed from predetermined regions of the n-type layer 15, the emitter capping layer 14b, and the collector layer 11b to form n-type ohmic electrode regions. AuGe/Ni is deposited on these n-type ohmic electrode regions and alloyed at a substrate temperature of about 400° C. to form the cathode electrode layer 31, the emitter electrode layer 35, and the collector electrode layers 33 (FIG. 12).

The insulating layer 21 is partially etched and removed from a predetermined region of the p-type layer 17, and at the same time, the insulating layer 21 and the tunnel barrier layer 18b are partially etched and removed from predetermined regions of the base layer 13b to form p-type ohmic electrode regions. Ti/Pt/Au is deposited in these p-type ohmic electrode regions to form the anode electrode layer 32 and the base electrode layers 34 (Note FIG. 13 and enlarged partial view thereof shown in FIG. 13A).

Figure 14:
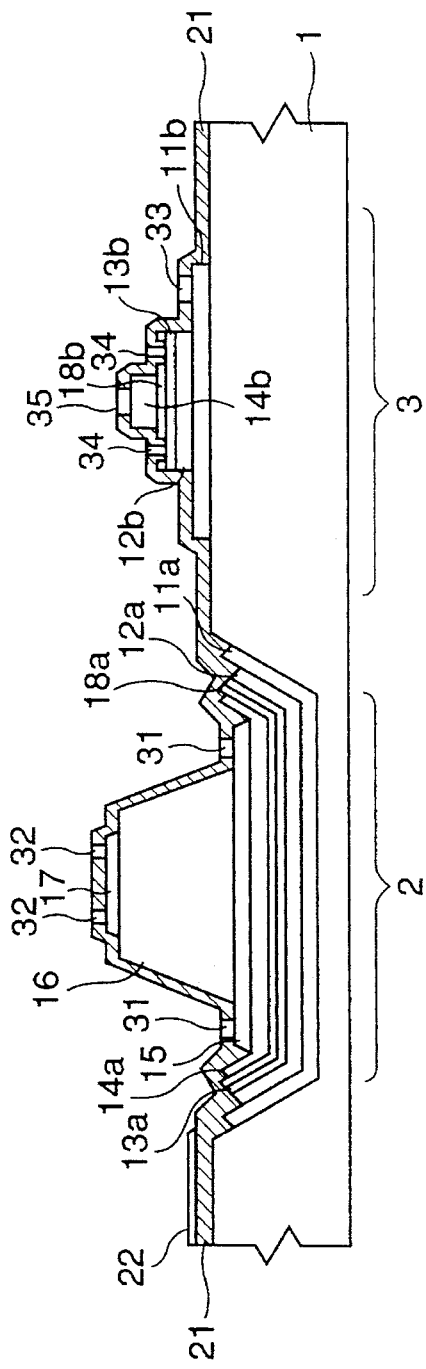

The metal resistance layer 22 having a predetermined pattern is formed on the insulating layer 21 excluding the pin-PD region 2 and the HBT region 3 and electrically connected to the pin-PD or the HBT (FIG. 14).

Figure 15:
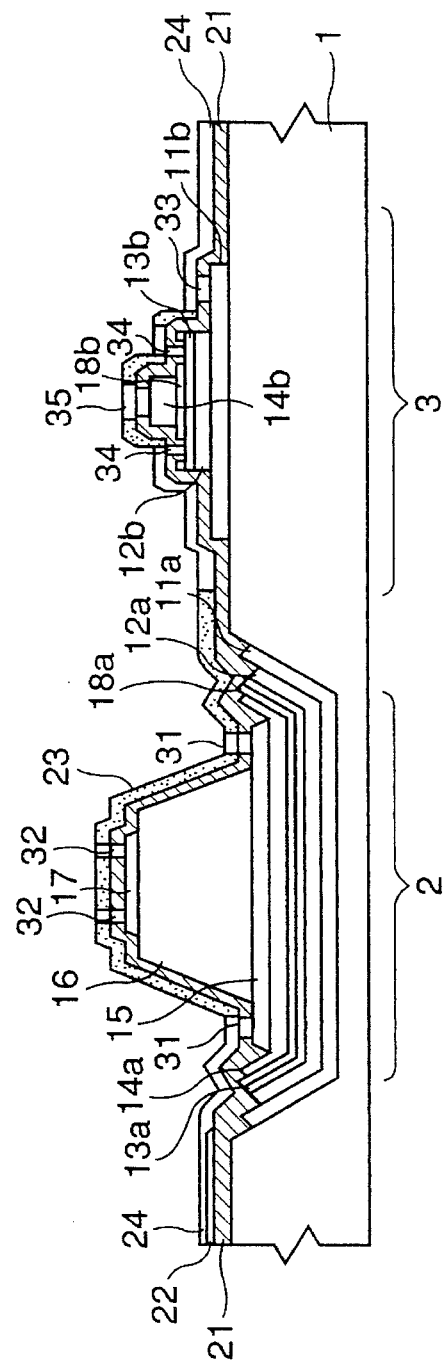

An insulating layer 23 is deposited on the surface of the semiconductor substrate 1 including the pin-PD region 2 and the HBT region 3. The insulating layer 23 is etched and removed from predetermined regions of the peripheral region including the cathode electrode layer 31, the anode electrode layer 32, the collector electrode layers 33, the base electrode layers 34, and the emitter electrode layer 35 to form lower wiring regions. The metal wiring layers 24 are formed in these lower wiring regions (FIG. 15).

Figure 16:
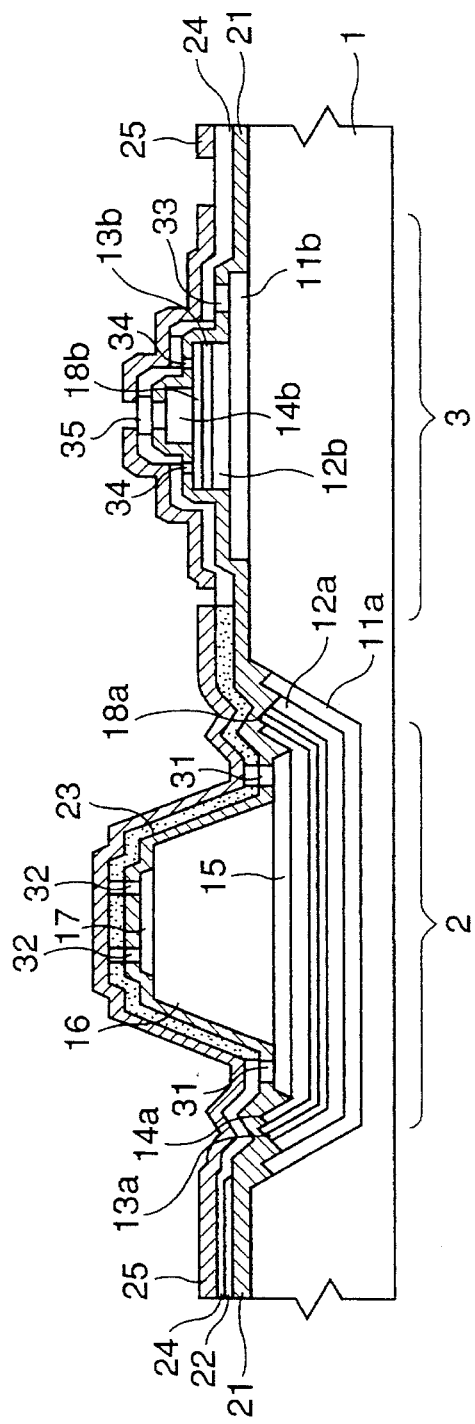

An insulating layer 25 is deposited on the surface of the semiconductor substrate 1 including the pin-PD region 2 and the HBT region 3. The insulating layer 25 is etched and removed from predetermined regions of the metal wiring layers 24 in the HBT region 3 to form contact holes (FIG. 16).

Figure 17:
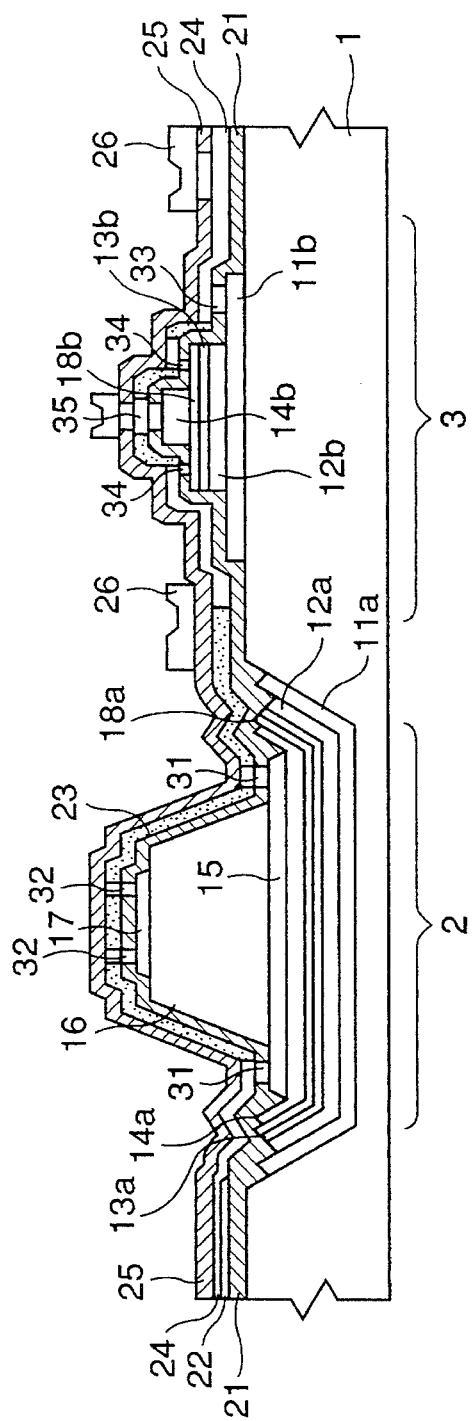

The metal wiring layers 26 are formed on these contact holes (FIG. 17).

An anti-reflection layer 27 is formed on the surface of the semiconductor substrate 1 including the pin-PD region 2 and the HBT region 3 (FIG. 18).

The insulating layers 21, 23, and 25 and the anti-reflection layer 27 are formed of SiN.

The anti-reflection layer 27 is etched and removed from predetermined regions of the metal wiring layers 26 to form pad portions, thereby completing the opto-electronic integrated circuit having desired pin-PD and HBTs (FIG. 19).

The function of the above manufacturing method will be described below.

In this method of manufacturing the opto-electronic integrated circuit, after the transistor and photodiode layers are sequentially formed on the semiconductor substrate 1, the semiconductor layers constituting the exposed photodiode layer as an upper layer are sequentially shaped, and the semiconductor layers constituting the transistor layer exposed upon removing the photodiode layer are sequentially shaped. For this reason, the pin-PD is constituted in the pin-PD region 2 of the semiconductor substrate 1 on the basis of the photodiode layer formed on the transistor layer. On the other hand, the HBT is constituted in the HBT region 3 of the semiconductor substrate 1 on the basis of only the transistor layer. Since a plurality of HBTs are commonly integrated for one pin-PD, the thickness of the HBTs larger in number than the pin-PD is set regardless of the thickness of the pin-PD. Therefore, the thickness of a high-resistivity layer 16 in the pin-PD is set with an increased degree of freedom.

After the recessed step portion 4 is formed in the semiconductor substrate 1, the transistor layer and the photodiode layer are sequentially formed, the pin-PD is formed in the inner region of the recessed step portion 4, and the HBT is formed in the outer region of the recessed step portion 4. Therefore, the difference in thickness between the HBT and the pin-PD is absorbed by the depth of the recessed step portion, and the pin-PD and the HBT are formed to have almost the same surface level.

In this case, after positioning is performed on the basis of the alignment marks A$_1$ formed on the semiconductor substrate 1 to form the recessed step portion 4, positioning is performed on the basis of the alignment marks A$_1$ to form the alignment marks A$_2$ on the uppermost semiconductor layer, and positioning is performed on the basis of the alignment marks A$_2$ to form the pin-PD and the HBT. For this reason, the pin-PD and the HBTs are arranged in the inner and peripheral regions of the recessed step portion 4 with high alignment accuracy.

The alignment mark A$_1$ is formed by two-dimensionally aligning the recessed portions, and the semiconductor layers constituting the transistor and photodiode layers are sequentially epitaxially grown on the semiconductor substrate 1. For this reason, as compared to a technique of two-dimensionally aligning projecting portions to form the alignment mark A$_1$, the difference in growth rate between the semiconductor layers with respect to different crystal faces on the surface of the semiconductor substrate 1 is decreased. Therefore, the semiconductor layers are prevented from being deformed in the growth process.

The emitter capping layer 14a and the n-type layer 15, i.e., the semiconductor layers in the boundary region where the transistor and photodiode layers are joined with each other, are formed of different materials on the semiconductor substrate 1. At this time, when an etchant is appropriately selected in correspondence with the material of each semiconductor layer, the n-type layer 15 is etched and removed without simultaneously etching and removing the emitter capping layer 14b. Therefore, after the pin-PD is formed, the HBT is formed with high reliability as desired.

The metal resistance layer 22 is formed to be electrically connected to the pin-PD or the HBTs. For this reason, as compared to a resistance layer formed of a semiconductor, variations in resistance with respect to a temperature are decreased.

The opto-electronic integrated circuit of the present invention is not limited to the above embodiment, and various changes and modifications can be made.

Figure 22:
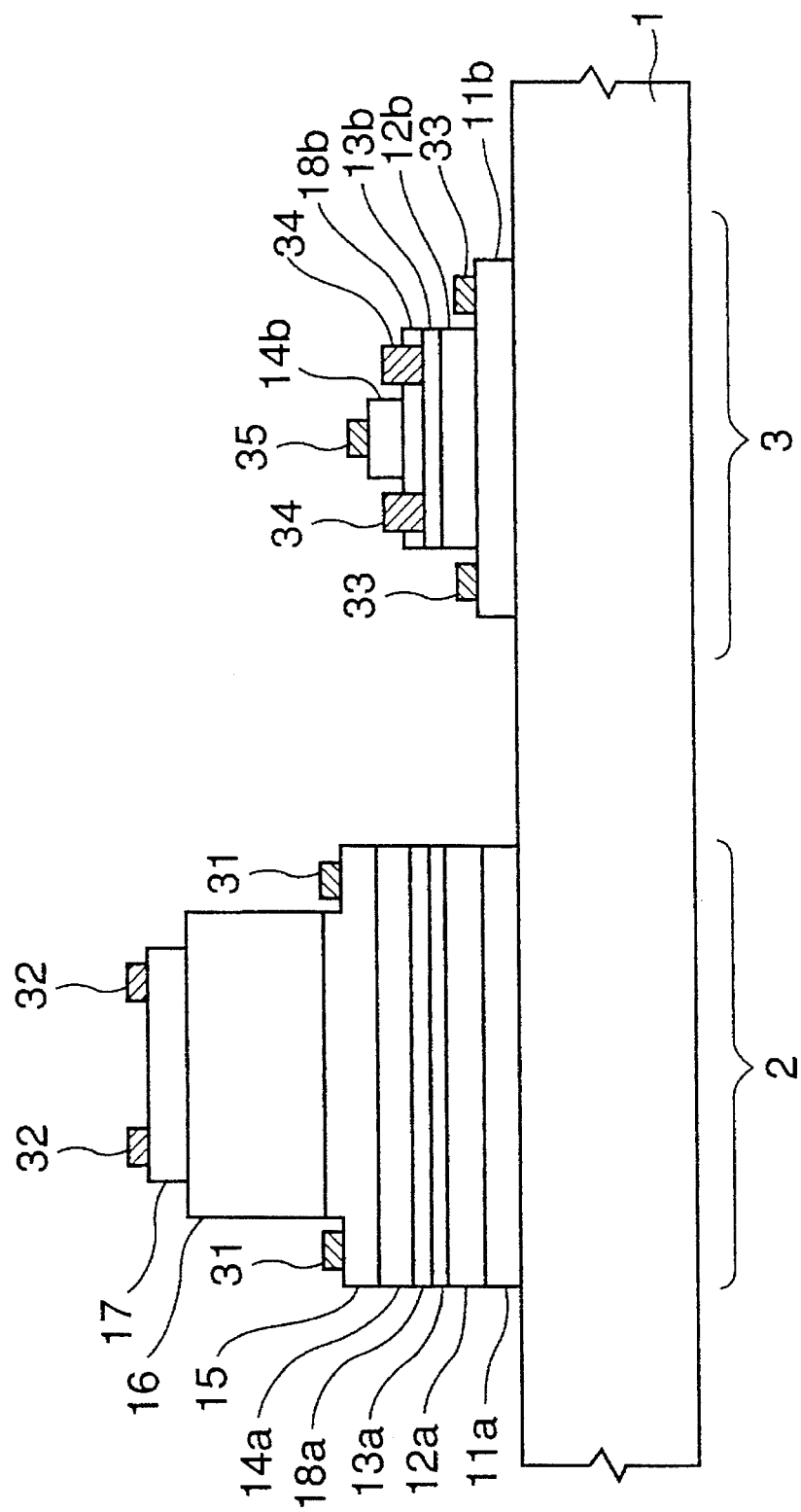
FIG. 22 is a sectional view showing the structure of the main part of a modification of the opto-electronic integrated circuit in FIG. 1.

FIG. 22 is a sectional view showing the structure of the main part of a modification of the opto-electronic integrated circuit in FIG. 1.

In the above embodiment, the pin-PD region of the semiconductor substrate is exemplified to be formed as the inner region of the recessed step portion. However, as shown in FIG. 22, the pin-PD region of the semiconductor substrate may also be formed flat as in the HBT region.

In the above embodiment and modification, the p-type layer of the pin-PD is formed of GaInAs. However, the p-type layer may also be formed of InP to obtain the same effect as described above.

In the above embodiment and modification, the pin-PD is constituted by sequentially forming the n-type layer, the i-type layer, and the p-type layer on the semiconductor substrate. However, the positions of the n-type layer and the p-type layer of the pin-PD may also be reversed to obtain the same effect as described above.

In the above embodiment and modification, the HBT is formed as a tunnel emitter type HBT. However, a conventional HBT can also provide the same effect as described above.

In the above embodiment and modification, the electrode layers having the n-type ohmic contact properties are formed of AuGe/Ni, and the electrode layers having the p-type ohmic contact properties are formed of Ti/Pt/Au. However, when all the electrode layers are formed to have a multilayered structure of Pt/Ti/Pt/Au with a Pt layer as the lowermost layer, the electrode characteristics with respect to the semiconductor layers in contact with the electrode layers are improved as compared to electrode layers having a lowermost layer formed of a material except for Pt.

The method of manufacturing the opto-electronic integrated circuit of the present invention is not limited to the above embodiment, and various changes and modifications can be made.

Figure 23:
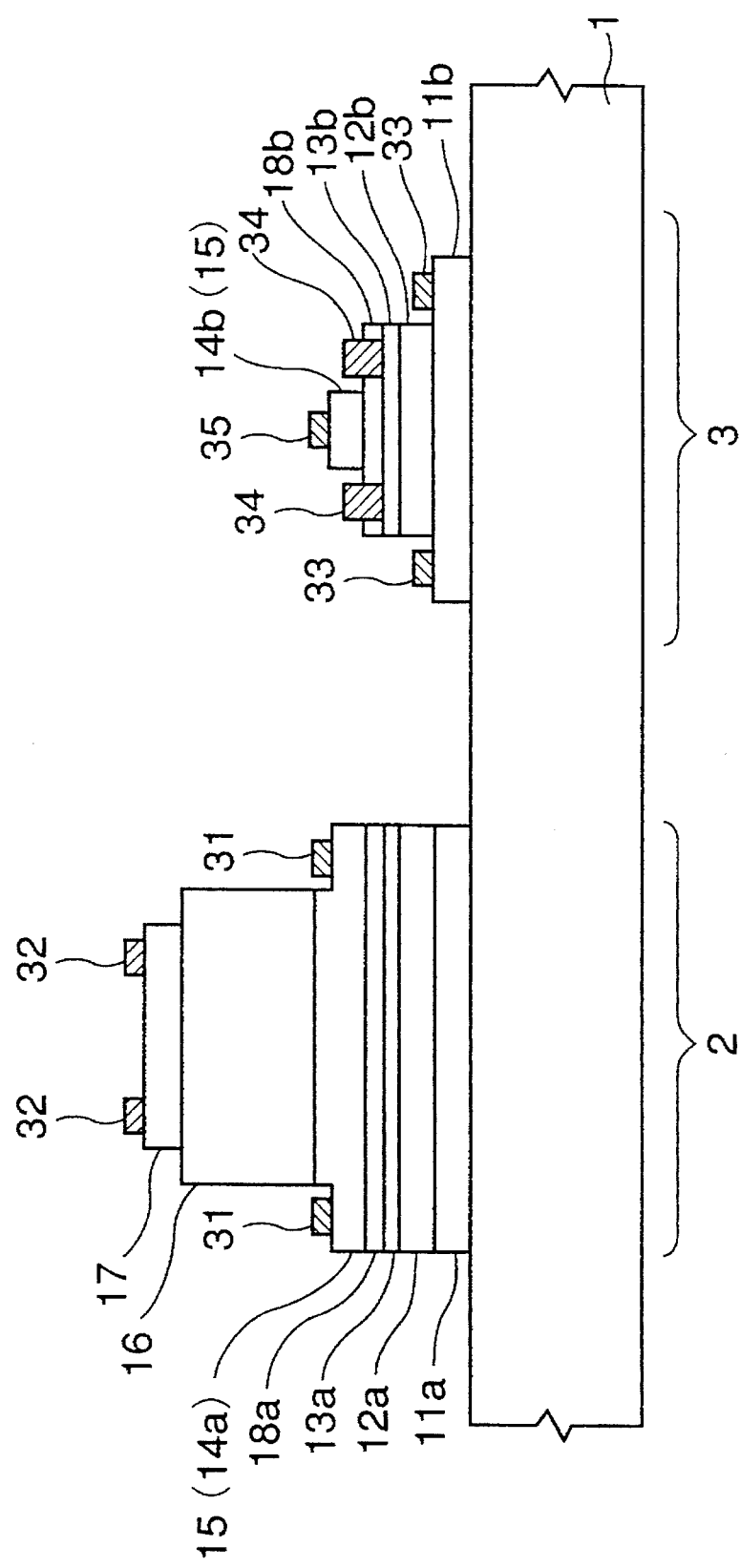
FIG. 23 is a sectional view showing the structure of the main part of the first modification of the opto-electronic integrated circuit in FIG. 22.
Figure 24:
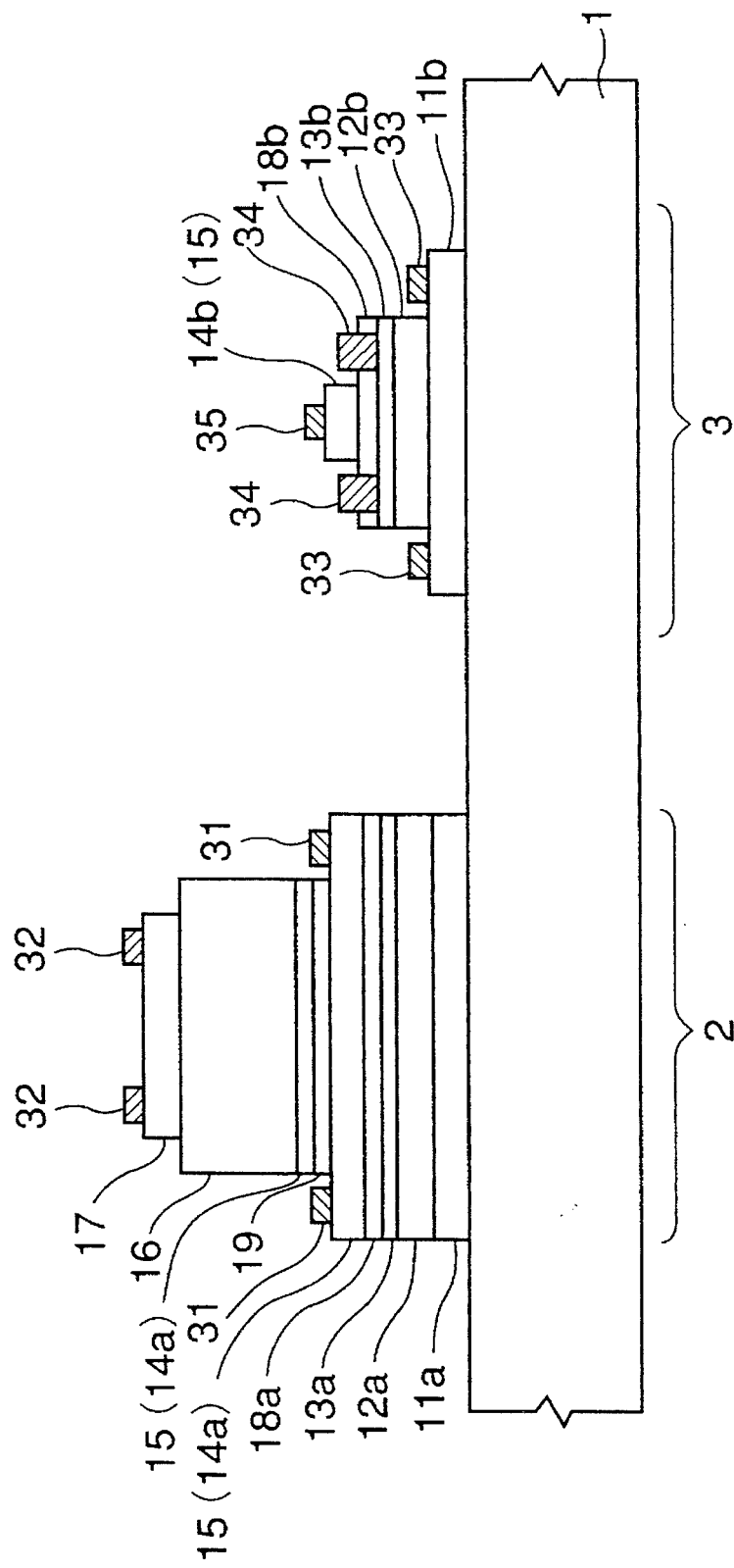
FIG. 24 is a sectional view showing the structure of the main part of the second modification of the opto-electronic integrated circuit in FIG. 22.
Figure 25:
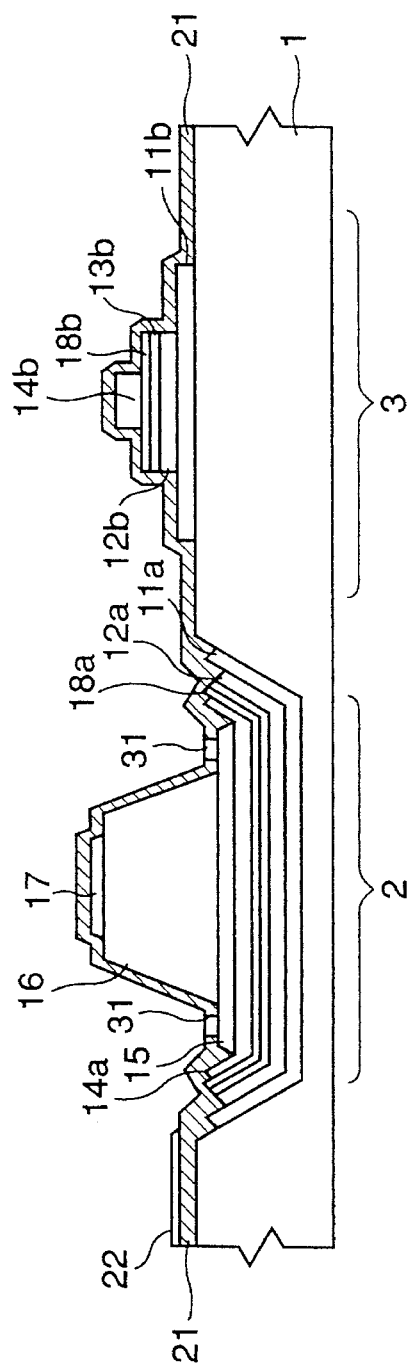
FIGS. 25 and 26 are sectional views showing steps in a modification of the method of manufacturing the opto-electronic integrated circuit in FIG. 1.
Figure 26:
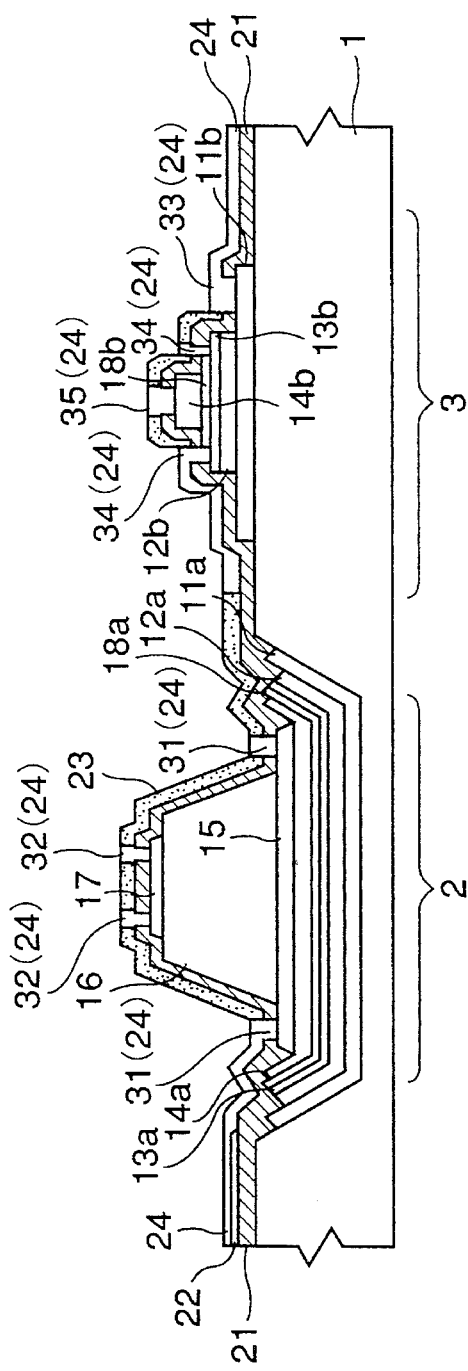

FIGS. 23 and 24 are sectional views showing the structures of the main parts of the first and second modifications of the opto-electronic integrated circuit in FIG. 22, respectively. FIGS. 25 and 26 are sectional views showing steps in a modification of the method of manufacturing the opto-electronic integrated circuit in FIG. 1.

The above embodiment exemplifies that after the recessed step portion is formed as the pin-PD region of the semiconductor substrate, the transistor and photodiode layers are sequentially formed on the semiconductor substrate. However, the pin-PD region of the semiconductor substrate may also be formed flat as in the HBT region, and the transistor and photodiode layers may be sequentially formed on the semiconductor substrate. The result of this manufacturing method is shown in FIG. 22.

In the above embodiment and modification, the emitter capping layer and the n-type layer, i.e., the semiconductor layers in the boundary region where the transistor and photodiode layers are joined with each other, are formed of different materials on the semiconductor substrate. However, when the emitter capping layer and the n-type layer are formed of the same material as a common layer, one process of the epitaxial growth is eliminated to decrease the operation steps. According to this manufacturing method, as shown in FIG. 23, the emitter capping layer 14a and the n-type layer 15 are formed as a common layer in the pin-PD region 2. However, it is necessary to measure the etching rate of an etchant for the constituent material of the common layer in advance and determine the etching time on the basis of the etching rate such that the portion of the emitter capping layer 14b is not simultaneously etched and removed upon etching and removing the portion of the n-type layer 15.

In this case, an etching stop layer consisting of a material having a band gap energy different from that of the constituent material of the common layer is formed inside the common layer or at the junction portion between the common layer and the i-type layer. With this structure, after formation of the pin-PD, the HBT is formed with high reliability as desired as compared to a structure without an etching stop layer. According to this manufacturing method, as shown in FIG. 24, an etching stop layer 19 is formed to be joined with the common layer in the pin-PD region 2. This is because an etchant is appropriately selected in correspondence of the materials of the common layer and the etching stop layer 19, so that the portion of the emitter capping layer 14b is not simultaneously etched and removed upon etching and removing the portion of the n-type layer 15.

In the above embodiment and modification, the electrode layers having the n-type ohmic contact properties and the electrode layers having the p-type ohmic contact properties are formed in the different processes. However, when all the electrode layers are simultaneously formed, one process of electrode formation is eliminated to decrease the operation steps.

In this case, these electrode layers are formed to have a multilayered structure of Pt/Ti/Pt/Au with a Pt layer as the lowermost layer. With this structure, the electrode characteristics with respect to the semiconductor layers in contact with the electrode layers are improved as compared to electrode layers having a lowermost layer consisting of a material except for Pt.

When the metal wiring layers electrically connected to the pin-PD or HBTs are simultaneously formed with these electrode layers, one process of electrode and wiring formation is eliminated to further decrease the operation steps. The steps in this manufacturing method are shown in FIGS. 25 and 26.

More specifically, subsequent to the step shown in FIG. 11, the insulating layer 21 is deposited on the surface of the semiconductor substrate 1 including the pin-PD region 2 and the HBT region 3, and the metal resistance layer 22 having a predetermined pattern is formed on the insulating layer 21 excluding the pin-PD region 2 and the HBT region 3 (FIG. 25).

The insulating layer 23 is then deposited on the surface of the semiconductor substrate 1 including the pin-PD region 2 and the HBT region 3. The insulating layers 21 and 23 are partially etched and removed from predetermined regions of the n-type layer 15, the p-type layer 17, the emitter capping layer 14b, and the collector layer 11b, and at the same time, the insulating layers 21 and 23 and the tunnel barrier layer 18b are partially etched and removed from predetermined regions of the base layer 13b to form the electrode regions. Subsequently, the insulating layer 23 is partially etched and removed from the peripheral regions of these electrode regions to form the lower electrode wiring regions. Pt/Ti/Pt/Au is deposited in these electrode regions and the lower wiring regions and alloyed at a substrate temperature of about 400° C., thereby forming the cathode electrode layer 31, the anode electrode layer 32, the collector electrode layers 33, the base electrode layers 34, the emitter electrode layer 35, and the metal wiring layers 24. The process moves to the step shown in FIG. 16 (FIG. 26).

As having been described above in detail, according to the present invention, the pin-PD is constituted on the basis of the photodiode layer formed on the first transistor layer, and the HBT is constituted on the basis of only the second transistor layer separated from the first transistor layer. Since the thickness of the HBTs larger in number than the pin-PD is set regardless of the thickness of the pin-PD, the thickness of the high-resistivity layer 16 in the pin-PD is set with an increased degree of freedom, thereby improving the conversion efficiency of received light.

The pin-PD and the HBTs are formed in the inner region and the outer region of the recessed step portion formed in the surface region of the semiconductor substrate, respectively, so that these devices are formed to have almost the same height. For this reason, the resist film is substantially uniformly coated upon forming the etching mask to decrease mask matching failures. In addition, disconnection of the metal wiring disposed after the pin-PD and the HBTs are shaped is decreased. Furthermore, the high-resistivity layer 16 in the pin-PD becomes thicker in correspondence with the depth of the recessed step portion, thereby improving the conversion efficiency of received light.

The semiconductor layers constituting the HBTs and the pin-PD are sequentially epitaxially grown on the semiconductor substrate on which the alignment marks having the two-dimensionally aligned recessed portions are formed. Since these semiconductor layers are prevented from being deformed in the growth process, each device is formed with high alignment accuracy.

The semiconductor layers with which the HBT and the pin-PD are joined are formed of different materials, or formed of the same material arranging the etching stop layer therein on the semiconductor substrate, and an etchant is appropriately selected in correspondence with the material. For this reason, the lowermost layer of the pin-PD is etched without simultaneously etching and removing the uppermost layer of the HBT, so that the HBT is satisfactorily formed as desired.

What is claimed is:

1. An opto-electronic integrated circuit comprising:
   a semiconductor substrate;
   a pin-type photodiode formed in a first surface region of said semiconductor substrate; and
   a heterojunction bipolar transistor formed in a second surface region of said semiconductor substrate and electrically connected to said pin-type photodiode,
   wherein said pin-type photodiode includes:
      a first transistor layer having:
         a first collector layer,
         a first base layer,
         a first tunnel barrier layer, and
         a first emitter capping layer,
         wherein said first collector layer, said first base layer, said first tunnel barrier layer and said first emitter capping layer are sequentially formed in said first surface region,
      a photodiode layer having:
         a layer of a first conductivity type,
         a high-resistivity layer,
         a layer of a second conductivity type,
         wherein said layer of first conductivity type, said high-resistivity layer and said layer of second conductivity type are sequentially formed on said first emitter capping layer of said first transistor layer, said layer of first conductivity type being in contact with said first emitter capping layer, a first electrode formed on and in contact with said layer of the first conductivity type, and a second electrode formed on said layer of the second conductivity type;
   wherein said heterojunction bipolar transistor includes:
      a second transistor layer having:
         a second collector layer,
         a second base layer,
         a second tunnel barrier layer,
         a second emitter capping layer,
         wherein said second collector layer, said second base layer, said second tunnel barrier layer and said second emitter capping layer are sequentially formed in said second surface region, and separated from said first transistor layer, and
         electrodes respectively formed on said second collector layer, said second base layer, and said second emitter capping layer.

2. A circuit according to claim 1, wherein said first and second surface regions are constituted as an inner region and an outer region, respectively, of a recessed step portion having a predetermined depth.

3. A circuit according to claim 1, wherein said first emitter capping layer and said layer of the first conductivity type are formed of different materials.

4. A circuit according to claim 1, wherein said first emitter capping layer and said layer of the first conductivity type are formed of the same material.

5. A circuit according to claim 1, wherein a metal resistance layer electrically connected to said pin-type photodiode or said heterojunction bipolar transistor is formed in a third surface region of said semiconductor substrate.

6. A circuit according to claim 1, wherein said second electrode and said electrode formed on said second base layer are formed of the same material.

7. A circuit according to claim 2, wherein said first emitter capping layer and said layer of the first conductivity type are formed of different materials.

8. A circuit according to claim 2, wherein said first emitter capping layer and said layer of the first conductivity type are formed of the same material.

9. A circuit according to claim 2, wherein a metal resistance layer electrically connected to said pin-type photodiode or said heterojunction bipolar transistor is formed in a third surface region of said semiconductor substrate.

10. A circuit according to claim 2, wherein said second electrode and said electrode formed on said second base layer are formed of the same material.

11. A circuit according to claim 3, wherein said semiconductor substrate, said first and second collector layers, said first and second base layers, said first and second tunnel barrier layers, said first and second emitter capping layers, said layer of the first conductivity type, said high-resistivity layer, and said layer of the second conductivity type consist essentially of InP, n-type GaInAs, p-type GaInAs, n-type InP, n-type GaInAs, n-type InP, i-type GaInAs, and p-type GaInAs, respectively.

12. A circuit according to claim 4, wherein said semiconductor substrate, said first and second collector layers, said first and second base layers, said first and second tunnel barrier layers, said first and second emitter capping layers, said layer of the first conductivity type, said high-resistivity layer, and said layer of the second conductivity type consist essentially of InP, n-type GaInAs, p-type GaInAs, n-type InP, n-type GaInAs, n-type GaInAs, i-type GaInAs, and p-type GaInAs, respectively.

13. A circuit according to claim 4, wherein an etching stop layer consisting of a material having a band gap energy different from that of a constituent material of said layer of said first conductivity type is formed inside said layer of said first conductivity type or at a junction portion between said layer of said first conductivity type and said high-resistivity layer.

14. A circuit according to claim 6, wherein said second electrode and said electrode formed on said second base layer are formed to have a multilayered structure including a Pt layer.

15. A circuit according to claim 6, further including a metal wiring layer electrically connected to said pin-type photodiode or said heterojunction bipolar transistor, said metal wiring layer being made of the same material as that of the second electrode and being formed in a fourth surface region of said semiconductor substrate.

16. A circuit according to claim 7, wherein said semiconductor substrate, said first and second collector layers, said first and second base layers, said first and second tunnel barrier layers, said first and second emitter capping layers, said layer of the first conductivity type, said high-resistivity layer, and said layer of the second conductivity type consist essentially of InP, n-type GaInAs, p-type GaInAs, n-type InP, n-type GaInAs, n-type InP, i-type GaInAs, and p-type GaInAs, respectively.

17. A circuit according to claim 8, wherein said semiconductor substrate, said first and second collector layers, said first and second base layers, said first and second tunnel barrier layers, said first and second emitter capping layers, said layer of the first conductivity type, said high-resistivity layer, and said layer of the second conductivity type consist essentially of InP, n-type GaInAs, p-type GaInAs, n-type InP, n-type GaInAs, n-type GaInAs, i-type GaInAs, and p-type GaInAs, respectively.

18. A circuit according to claim 8, wherein an etching stop layer consisting of a material having a band gap energy different from that of a constituent material of said layer of said first conductivity type is formed inside said layer of said first conductivity type or at a junction portion between said layer of said first conductivity type and said high-resistivity layer.

19. A circuit according to claim 10, wherein said second electrode and said electrode formed on said second base layer are formed to have a multilayered structure including a Pt layer.

20. A circuit according to claim 10, further including a metal wiring layer electrically connected to said pin-type photodiode or said heterojunction bipolar transistor, said metal wiring layer being made of the same material as that of the second electrode and being formed in a fourth surface region of said semiconductor substrate.

21. An opto-electronic integrated circuit comprising:
(A) a semiconductor substrate;
(B) a pin-type photodiode formed in a first surface region of said semiconductor substrate, wherein said pin-photodiode includes:
(a) a first transistor layer formed on said first surface region of said semiconductor substrate, wherein said first transistor layer includes:

a first collector layer formed on said first surface region of said substrate,
a first base layer formed on said first collector layer,
a first tunnel barrier layer formed on said first base layer, and
a first emitter capping layer formed on said first tunnel barrier layer,
(b) a photodiode layer formed on said first transistor layer, wherein said photodiode layer includes:
a first conductivity type semiconductor layer formed on said first emitter capping layer,
a high-resistivity layer formed on said first conductivity type semiconductor layer,
a second conductivity type semiconductor layer formed on said high-resistivity layer,
a first electrode formed on said first conductivity type semiconductor layer, and
a second electrode formed on said second conductivity type semiconductor layer; and
(C) a heterojunction bipolar transistor formed in a second surface region of said semiconductor substrate and electrically connected to said pin-type photodiode, wherein said heterojunction bipolar transistor includes:
(a) a second transistor layer formed on said second surface region of said semiconductor substrate, said second transistor layer being separated from said first transistor layer, wherein said second transistor layer includes:
a second collector layer formed on said second surface region of said semiconductor substrate,
a second base layer formed on said second collector layer,
a second tunnel barrier layer formed on said second base layer,
a second emitter capping layer formed on said second tunnel barrier layer,
a first electrode formed on said second collector layer,
a second electrode formed on said second base layer, and
a third electrode formed on said second emitter capping layer.

22. A circuit according to claim 21, wherein said first conductivity type semiconductor layer of said photodiode layer includes InP, and wherein said high-resistivity layer includes GaInAs having different etching characteristics from InP, whereby said high-resistivity layer is selectively etched against said first conductivity type semiconductor layer.

23. A circuit according to claim 21 wherein said first conductivity type semiconductor layer of said photodiode layer includes InP, and wherein said high-resistivity layer includes of GaInAs.

* * * * *